United States Patent
Shin et al.

(10) Patent No.: US 11,158,275 B2
(45) Date of Patent: Oct. 26, 2021

(54) DISPLAY DEVICE

(71) Applicant: Samsung Display Co., LTD., Yongin-si (KR)

(72) Inventors: Dong Hee Shin, Asan-si (KR); Geun Ho Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/853,751

(22) Filed: Apr. 21, 2020

(65) Prior Publication Data

US 2021/0065642 A1    Mar. 4, 2021

(30) Foreign Application Priority Data

Aug. 27, 2019   (KR) ......................... 10-2019-0105226

(51) Int. Cl.
*G09G 3/36* (2006.01)
*G02F 1/133* (2006.01)
(Continued)

(52) U.S. Cl.
CPC ......... *G09G 3/3674* (2013.01); *G02F 1/1368* (2013.01); *G02F 1/13306* (2013.01); *G02F 1/133345* (2013.01); *G02F 1/136286* (2013.01); *G02F 2201/121* (2013.01); *G02F 2201/123* (2013.01); *G09G 2310/06* (2013.01); *G09G 2320/0223* (2013.01)

(58) Field of Classification Search
CPC ......... G09G 3/29–2948; G09G 3/3266; G09G 3/3611–3644; G09G 2300/0838–0895; G09G 2310/00–0297; G09G 1/143
See application file for complete search history.

(56) References Cited

U.S. PATENT DOCUMENTS

| | | |
|---|---|---|
| 6,894,755 B2 | 5/2005 | Yu |
| 8,558,776 B2 | 10/2013 | Lee et al. |

(Continued)

FOREIGN PATENT DOCUMENTS

| | | |
|---|---|---|
| CN | 103472606 | 2/2017 |
| KR | 10-1365055 | 2/2014 |

(Continued)

*Primary Examiner* — Sanghyuk Park
(74) *Attorney, Agent, or Firm* — H.C. Park & Associates, PLC

(57) ABSTRACT

A display device includes: a first substrate including a gate driver disposed in a non-display area; and a second substrate including a common electrode disposed apart from the first substrate, the gate driver includes: first and second clock wires configured to supply first and second clock signals, respectively; first and second stages configured to receive the first and second clock signals, respectively; a first connection line connecting the first clock wire and the first stage; a second connection line connecting the second clock wire and the second stage; a first contact portion connecting the first clock wire and the first connection line; and a second contact portion connecting the second clock wire and the second connection line. The common electrode includes: first and second openings corresponding to the first and second contact portions, respectively. The first opening and the second opening have different sizes in a plan view.

20 Claims, 22 Drawing Sheets

(51) Int. Cl.
*G02F 1/1333* (2006.01)
*G02F 1/1368* (2006.01)
*G02F 1/1362* (2006.01)

(56) References Cited

U.S. PATENT DOCUMENTS

| | | | |
|---|---|---|---|
| 8,711,318 B2 | 4/2014 | Ahn et al. | |
| 10,204,564 B2 | 2/2019 | No et al. | |
| 2015/0070616 A1* | 3/2015 | Ogasawara | G02F 1/1368 |
| | | | 349/43 |
| 2018/0315387 A1* | 11/2018 | Park | G09G 3/3275 |
| 2019/0288008 A1* | 9/2019 | Park | G09G 3/3677 |
| 2019/0333461 A1* | 10/2019 | Kikuchi | G09F 9/30 |

FOREIGN PATENT DOCUMENTS

| | | |
|---|---|---|
| KR | 10-1427584 | 8/2014 |
| KR | 10-2017-0080848 | 7/2017 |

* cited by examiner

DISPLAY DEVICE

CROSS-REFERENCE TO RELATED APPLICATION

This application claims priority from and the benefit of Korean Patent Application No. 10-2019-0105226 filed on Aug. 27, 2019, which is hereby incorporated by reference for all purposes as if fully set forth herein.

BACKGROUND

Field

Exemplary embodiments of the invention relate generally to a display device, and more particularly, to a display device including a gate driver integrated on a substrate.

Discussion of the Background

As display devices are developed, various display devices are being used, and liquid crystal displays (LCD) and organic light emitting diode (OLED) displays are representative display devices.

A liquid crystal display (LCD) is one of various display devices currently used. The liquid crystal display (LCD) displays grayscale by adjusting the transmittance of light transmitted through liquid crystal molecules.

Liquid crystal displays (LCDs) include a gate driver that outputs a gate signal to select a plurality of pixels. The gate driver includes a plurality of stages, and each stage operates by receiving a clock signal. Each stage and a clock wire that applies and clock signal are formed with pixels on the substrate.

The above information disclosed in this Background section is only for understanding of the background of the inventive concepts, and, therefore, it may contain information that does not constitute prior art.

SUMMARY

Devices constructed/methods according to exemplary embodiments of the invention are capable of providing a display device in which a gate signal output from each stage is maintained to a substantially constant value by setting or limiting a difference in capacitance generated by different clock wires connected to each stage to a predetermined level or less.

Additional features of the inventive concepts will be set forth in the description which follows, and in part will be apparent from the description, or may be learned by practice of the inventive concepts.

According to one or more exemplary embodiments of the invention, a display device includes: a first substrate including a display area and a non-display area, the first substrate including a gate driver disposed in the non-display area; and a second substrate including a common electrode, the second substrate being disposed apart from the first substrate, wherein the gate driver includes: a first clock wire configured to supply a first clock signal; a second clock wire configured to supply a second clock signal different from the first clock signal; a first stage configured to receive the first clock signal from the first clock wire; a second stage configured to receive the second clock signal from the second clock wire; a first connection line connecting the first clock wire and the first stage; a second connection line connecting the second clock wire and the second stage; a first contact portion electrically connecting the first clock wire and the first connection line; and a second contact portion electrically connecting the second clock wire and the second connection line, wherein the common electrode includes: a first opening corresponding to the first contact portion; and a second opening corresponding to the second contact portion, and wherein the first opening and the second opening have different size in a plan view.

The first substrate may further include a gate conductive layer including the first clock wire and the second clock wire.

The first substrate may further include a data conductive layer including the first connection line and the second connection line.

The first substrate may further include a pixel electrode layer including the first contact portion and the second contact portion.

The display device may further include: a first insulation layer disposed between the gate conductive layer and the data conductive layer; and a second insulation layer disposed between the data conductive layer and the pixel electrode layer. Openings may be formed in the first insulation layer and the second insulation layer, openings respectively exposing a part of the first clock wire, a part of the second clock wire, a part of the first connection line, and a part of the second connection line. The first contact portion connects the first clock wire and the first connection line to the first insulation layer and the second insulation layer, respectively, through the openings corresponding to an exposed part of the first clock wire and the part of the first connection line. The second contact portion connects the second clock wire and the second connection line to the first insulation layer and the second insulation layer, respectively, through the openings corresponding to the exposed part of the second clock wire and the part of the second connection line.

The first opening has a larger planar area than the first contact, the second opening has a larger planar area than the second contact, and the common electrode may not be overlapping with the first contact and the second contact in the plan view.

The display device may further include a semiconductor layer that is disposed below the first connection line and the second connection line.

The first connection line includes a first section extending in a first direction and a second section extending in a second direction bent from the first section, the second section of the first connection line overlapping with the first clock wire. The second connection line may include a first section extending in the first direction and a second section extending in the second direction bent from the first section, the second section of the second connection line overlapping with the second clock wire.

Openings may be formed in the first clock wire and the second clock wire such that light may be transmitted therethrough.

At least a part of the first clock signal having an enable level may overlap with a part of the second clock signal having the enable level.

The first clock wire may be distanced from the first stage at a first distance, and the second clock wire may be distanced from the second stage at a second distance. The first opening may be larger than the second opening in the plan view and the first distance may be greater than the second distance.

At least one of the first connection line and the second connection line includes an additional resistor. The first connection line and the second connection line may have the same resistance, and the additional resistor may be configured to compensate for the resistance difference between the first connection line and the second connection line due to a difference between the first distance and the second distance.

The gate driver may further include: third clock wire configured to supply a third clock signal; a third stage configured to receive the third clock signal from the third clock wire; a third connection line connecting the third clock wire and the third stage; and a third contact portion electrically connecting the third clock wire and the third connection line. The common electrode may further include: a third opening corresponding to the third contact portion, and the third opening may have the same size as one of the first opening and the second opening in the plan view.

The gate driver may further include: a third clock wire configured to supply a third clock signal; a fourth clock wire configured to supply a fourth clock signal; a third stage configured to receive the third clock signal from the third clock wire; a fourth stage configured to receive the fourth clock signal from the fourth clock wire; a third connection line connecting the third clock wire and the third stage; a fourth connection line connecting the fourth clock wire and the fourth stage; a third contact portion electrically connecting the third clock wire and the third connection line; and a fourth contact portion electrically connecting the fourth clock wire and the fourth connection line, the first opening may correspond to the third contact portion, and the second opening may correspond to the fourth contact portion.

According to one or more exemplary embodiments of the invention, a display device includes: a first substrate including a display area and a non-display area, the first substrate including a gate driver disposed in the non-display area; and a second substrate that includes a common electrode, the second substrate being disposed apart from the first substrate, wherein the gate driver includes: a plurality of clock wires configured to supply a plurality of clock signals; a plurality of stages configured to receive the plurality of clock signals respectively from the plurality of clock wires; and a plurality of connection lines electrically connecting the plurality of clock wires respectively with the plurality of stages, wherein the common electrode includes a plurality of openings corresponding to portions where the plurality of connection lines and the plurality of clock wires may be electrically connected, and wherein the plurality of openings including a first opening and a second opening, the first opening distanced farther than the second opening and the first opening may be larger than the second opening in a plan view.

The plurality of clock wires include: a first clock wire configured to transmit a plurality of clock signals; and a second clock wire configured to transmit a plurality of clock bar signals, the plurality of clock bar signals being antiphase with respect to the plurality of clock signals.

A total number of clock wires may be one of 8, 12, and 16.

The gate driver may further include a low voltage wire and a start signal wire.

The number of start signal wires may be half the number of clock wires.

The plurality of connection lines may further include: a plurality of additional resistors having lengths corresponding to the distance difference between the stage and the plurality of clock wires.

According to the exemplary embodiments, the openings formed in the common electrode may have difference sizes to reduce the capacitance difference between the clock wiring connection portions connected to respective stages and the common electrode to a predetermined value or less. As a result, the clock signal input to the stages may have reduced delay. Hence, it outputs a constant gate signal at every stage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
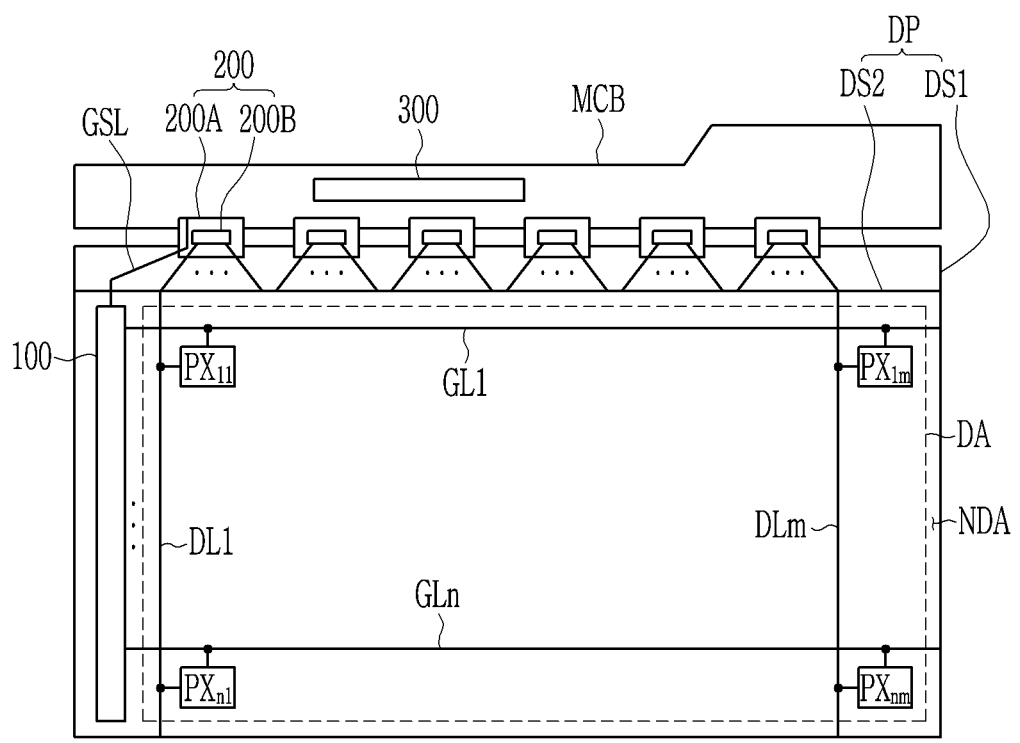
FIG. 1 is a top plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

In this specification, the phrase "on a plane" means viewing a target portion from the top in a plan view, and the phrase "on a cross-section" means viewing a cross-section formed by vertically cutting a target portion from the side.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a top plan view of a display device according to an exemplary embodiment.

A display device according to an exemplary embodiment includes a display panel DP, a gate driver 100, a data driver 200, and a signal controller 300.

The display panel DP is a liquid crystal panel, and includes a first substrate DS1 (hereinafter also referred to as a lower substrate), a second substrate DS2 (hereinafter also referred to as an upper substrate), and a liquid crystal layer disposed between the first substrate DS1 and the second substrate DS2. On a plane, the display panel DP is divided into a display area DA that displays an image by a plurality of pixels PX11 to PXnm, and a non-display area NDA surrounding the display area DA. The display area DA includes all of the first substrate DS1, the second substrate DS2, and the liquid crystal layer, and the non-display area NDA may not include at least one of the first substrate DS1, the second substrate DS2, and the liquid crystal layer.

The display panel DP includes a plurality of gate lines GL1 to GLn on the first substrate DS1, and a plurality of data lines DL1 to DLm that cross the gate lines GL1 to GLn. The plurality of gate lines GL1 to GLn are connected with the gate driver 100. The plurality of data lines DL1 to DLm are connected to the data driver 200. In FIG. 1, some of the plurality of gate lines GL1 to GLn and some of the plurality of data lines DL1 to DLm are illustrated.

The plurality of gate lines GL1 to GLn and the plurality of data lines DL1 to DLm are respectively connected with the plurality of pixels PX11 to PXnm. In the exemplary embodiment of FIG. 1, one gate line and one data line are connected with one pixel, but this is not restrictive. In FIG. 1, some among the plurality of pixels PX11 to PXnm are illustrated.

The plurality of pixels PX11 to PXnm may be classified into a plurality of groups depending on a displaying color. The plurality of pixels PX11 to PXnm may display one of primary colors. The primary colors may include red, green, and blue. Meanwhile, this is not restrictive, and the primary colors may further include various colors such as yellow, cyan, magenta, white, and the like.

The gate driver 100 and the data driver 200 receive a control signal from the signal controller 300. The signal controller 300 may be mounted on a main circuit board MCB. The signal controller 300 receives image data and control signals (a synchronization signal, a clock signal, an enable signal, etc.) from an external graphics controller (not shown). Some of the received control signals are transmitted to the gate driver 100, and some other control signals and image data are transmitted to the data driver 200.

First, the gate driver 100 generates a gate signal based on a control signal (hereinafter, a gate control signal) received from the signal controller 300 through a signal line GSL, and outputs the gate signal to the plurality of gate lines GL1 to GLn. The gate driver 100 may be formed on the first substrate DS1 in the same process as the plurality of pixels PX11 to PXnm through a thin film process. For example, the gate driver 100 may be mounted in the form of an amorphous silicon TFT gate driver circuit (ASG) or an oxide semiconductor TFT gate driver circuit (OSG) in the non-display area NDA.

FIG. 1 exemplarily illustrates one gate driver 100 connected to left ends of the plurality of gate lines GL1 to GLn. However, in another exemplary embodiment, two gate driving circuits may be included. One of the two gate driving circuits may be connected to the left ends of the plurality of gate lines GL1 to GLn, and the other gate driving circuit may be connected to the right ends of the plurality of gate lines GL1 to GLn. In addition, one of the two gate driving circuits may be connected with odd-numbered gate lines and the other may be connected to even-numbered gate lines.

Meanwhile, the data driver 200 changes image data to a data voltage and outputs the data voltage to each of the data lines DL1 to DLm according to the timing. The data driver 200 generates gray voltages according to the image data provided from the signal controller 300 based on a control signal (hereinafter, a data control signal) received from the signal controller 300. The data driver 200 outputs gray voltages as data voltages to the plurality of data lines DL1 to DLm.

The data voltages may include negative data voltages having positive values and/or negative values with respect to common voltages. Some of the data voltages applied to the data lines DL1 to DLm during each period may have a positive polarity and others may have a negative polarity. The polarities of the data voltages can be reversed by at least one frame or by at least one line unit to prevent or suppress degradation of the liquid crystal. The data driver 200 may generate inverted data voltages in the frame section unit in response to the inversion signal.

The data driver 200 may include driving chips 200A and flexible circuit boards 200B where the driving chips 200A are mounted. The flexible circuit board 200B electrically connects the main circuit board MCB and the first substrate DS1. The plurality of driving chips 200A process data signals corresponding to the corresponding data lines DL1 to DLm among the plurality of data lines DL1 to DLm and provide the processed data signals as data voltages.

FIG. 1 exemplarily illustrates a tape carrier package (TCP) type of data driver 200. In another exemplary embodiment, the data driver 200 may be provided as a chip on glass (COG) type and may be disposed on the non-display area NDA of the first substrate DS1.

The liquid crystal display that additionally includes the liquid crystal panel may further include a pair or polarizer layers and a backlight unit, which are not illustrated.

Hereinafter, a structure of the gate driver and a clock signal applied to the gate driver will be described with reference to FIG. 2 and FIG. 3.

Figure 2:
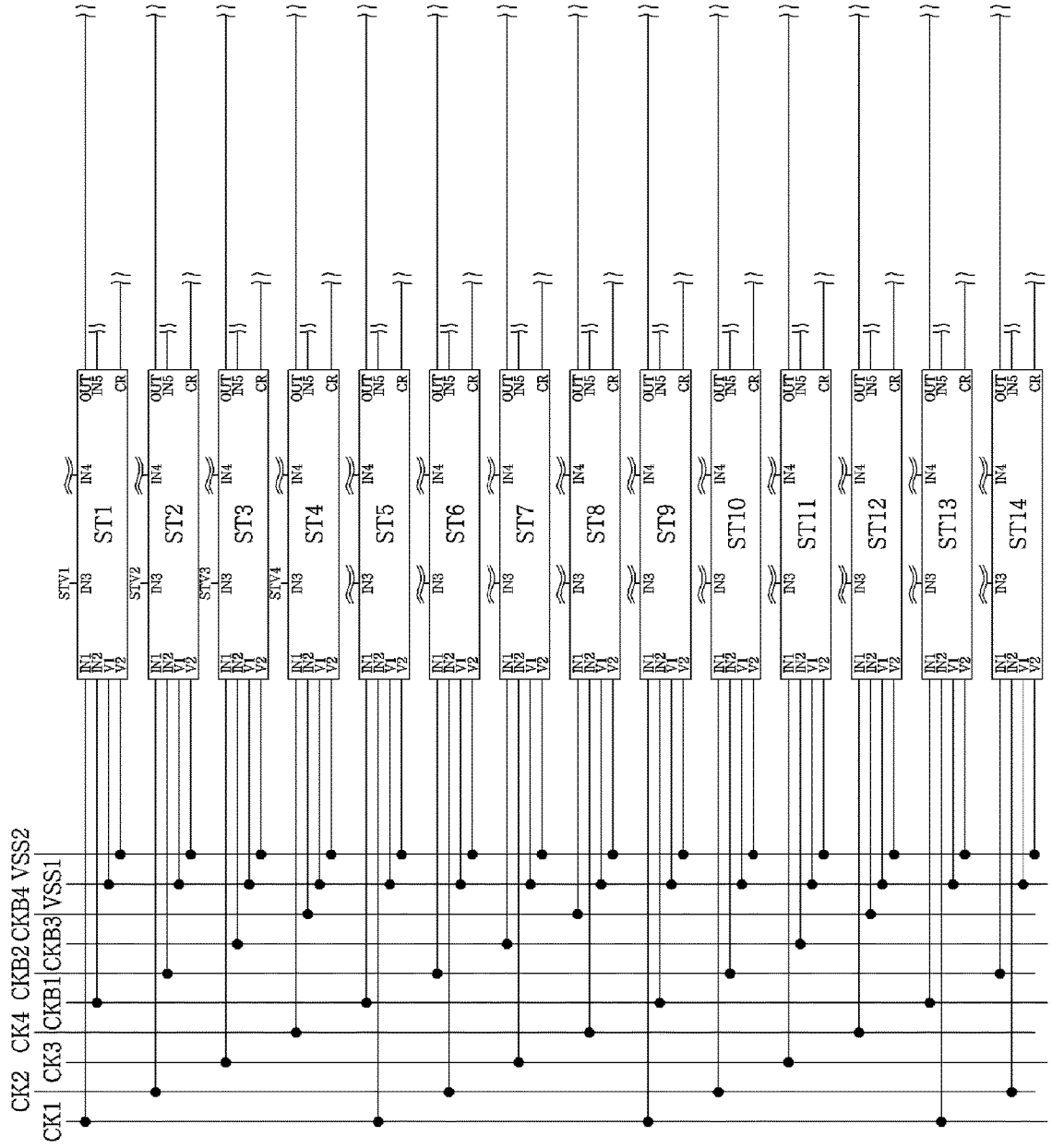
FIG. 2 is a block diagram of a connection relationship of a plurality of stages and wires of a wiring portion of the gate driver.
Figure 3:
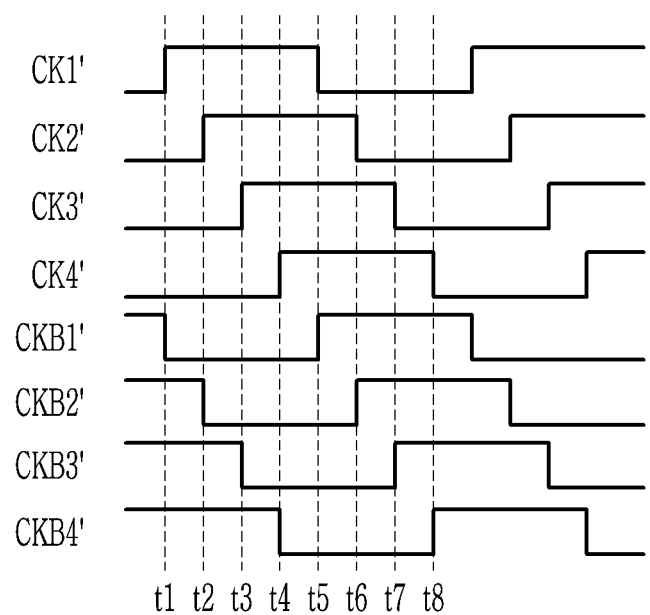
FIG. 3 is a waveform diagram of the clock signal applied to the gate driver of FIG. 2.

FIG. 2 is a block diagram of a connection relationship of a plurality of stages and wires of a wiring portion of the gate driver, and FIG. 3 is a waveform diagram of the clock signal applied to the gate driver of FIG. 2.

As shown in FIG. 2, the gate driver 100 includes a plurality of stages.

Each stage includes an output terminal OUT, a carry terminal CR, first to fifth input terminals IN1 to IN5, a first voltage terminal V1, and a second voltage terminal V2.

As shown in FIG. 3, each stage is connected with one of first clock wires CK1 to CK4 to which four clock signals CK1' to CK4' having different timings are applied, and the one of second clock wires CKB1 to CKB4 to which four clock bar signals CKB1' to CKB4', which are respectively antiphase, are applied. Hereinafter, the first clock wires CK1 to CK4 and the second clock wires CKB1 to CKB4 are may be called clock wires.

For example, the clock signal CK1' and the clock bar signal CKB1' that is antiphase to the clock signal CK1' may be input to the first stage ST1 and the fifth stage ST5. A clock signal CK2' that is shifted by ⅛ of a cycle with respect to the clock signal CK1' and a clock bar signal KB2' that is antiphase may be input to a second stage ST2, which is the next stage to the first stage ST1, and a sixth stage ST6, which is the next stage to the fifth stage ST5. A clock signal CK3' that is shifted by ¼ of a cycle with respect to the clock signal CK1' and shifted by ⅛ of a cycle with respect to the clock signal CK2', and a clock bar signal CKB3', which is an antiphase to the clock signal CK3', may be input to a third stage ST3, which is the next stage of the second stage ST3 and a seventh stage ST7, which is the next stage to the sixth stage ST6. A clock signal CK4' that is shifted by ¼ of a cycle with respect to the clock signal CK2' and shifted by ⅛ of a cycle with respect to the clock signal CK3', and a clock bar signal CKB4', which is an antiphase to the clock signal CK4', may be input to a fourth stage ST4, which is the next stage of the third stage ST3 and an eighth stage ST8, which is the next stage to the seventh stage ST7. Stages next to the eighth stage ST8 are respectively connected with one of the clock signals CK1' to CK4' and one of clock bar signals CKB1' to CKB4' by the same method described above.

One of the fourth clock signals CK1' to CK4' and one of the four clock bar signals CKB1' to CKB4' may be respectively input to a first input terminal IN1 or a second input terminal IN2 among input terminals of the respective stages.

For example, the clock signal CK1' may be input to the first input terminal IN1 and the clock bar signal CKB1' may be input to the second input terminal IN2 of the first stage ST1. The clock bar signal CKB1' may be input to the first input terminal Ni and the clock signal CK1' may be input to the second input terminal IN2 of the fifth stage ST5.

The clock signal CK1' has a corresponding rising edge at t1. The clock signal CK2 has a corresponding rising edge at t2, which is later than t1. The clock signal CK3' has a corresponding rising edge at t3, which is later than t2. The clock signal CK4' has a corresponding rising edge at t4, which is later than t3.

The clock bar signal CKB1' has a corresponding rising edge at t5, which is later than t4. The clock bar signal CKB2' has a corresponding rising edge at t6, which is later than t5. The clock bar signal CKB3' has a corresponding rising edge at t7, which is later than t6. The clock bar signal CKB4' has a corresponding rising edge at t8, which is later than t7.

A duty ratio of the clock signals CK1' to CK4' and the clock bar signals CKB1' to CKB4' may be 50%. The clock bar signal CKB1' is an inversion signal of the clock signal CK1', the clock bar signal CKB2' is an inversion signal of the clock signal CK2', the clock bar signal CKB3' may be an inversion signal of the clock signal CK3', and the clock bar signal CKB4' may be an inversion signal of the clock signal CK4'.

As shown in FIG. 3, the four clock signals CK1' to CK4' and the four clock bar signals CKB1' to CKB4' have waveforms that are sequentially shifted by ⅛ of a cycle. Overlapped portions exist between the four clock signals CK1' to CK4' and the four clock bar signals CKB1' to CKB4'. That is, there is a section during which a voltage of the same level exist. However, except for the clock signal and the clock bar signal, which are in antiphase, there is a section where voltages of the same level are applied to each other and overlap each other.

In the present exemplary embodiment, it is exemplarily described that four clock signals and four clock bar signals, each having different timing, are alternately applied to the respective stages, but the present invention is not limited thereto. Alternatively, four clock signals, each having different timing, may be applied to the respective stages.

The multiple of stages ST1 to ST4 shown in FIG. 2 have a dependent connection and thus operate in response to carry signals output from the previous stage and carry signals output from the next stages. Each stage receive a carry signal from stages other than the current stage through the third input terminal IN3, the fourth input terminal IN4, and the fifth input terminal IN5. Depending on exemplary embodiments, only one or two of the third input terminal IN3, the fourth input terminal IN4, and the fifth input terminal IN5 may be included.

In FIG. 2, inputs of the third input terminal IN3, the fourth input terminal IN4, and the fifth input terminal IN5 are illustrates in detail, but in the present exemplary embodiment, a carry signal may be received from a stage before four stages through the third input terminal IN3, a carry signal may be received from a stage after 6 stages through the fourth input terminal IN4, and a carry signal may be received from a stage after eight stages through the fifth input terminal IN5.

In the present exemplary embodiment, the plurality of stages ST1 to ST14 receive a first low voltage and a second low voltage. For example, the first low voltage may be input to the first voltage terminal V1, and the second low voltage may be input to the second voltage terminal V2.

The first low voltage and the second low voltage may have the same or different voltage levels. For example, the second low voltage has a lower voltage level than the first low voltage.

In exemplary embodiments, the plurality of stages ST1 to ST14 are each connected with a plurality of gate lines GL1 to GL14, and a gate signal is output through an output terminal OUT and transmitted to the connected the gate line.

Each stage includes a carry terminal CR that outputs a carry signal, and the carry signal output from the carry terminal CR may be a signal having the same timing as the gate signal output from the output terminal OUT.

In addition, the plurality of stages ST1 to ST14 receive carry signals from corresponding previous stages. The first to fourth stages ST1 to ST4 receive start signals STV1 to STV4 that start driving of the gate driver 100 instead of receiving the carry signal of the previous stage. The start signals STV1 to STV4 are periodical signals that are sequentially enabled.

Hereinafter, referring to FIG. 4 and FIGS. 5A, 5B, 5C, and 5D, a detailed structure of a wiring portion where clock wires (a first clock wire applying a clock signal, a second clock wire applying a clock bar signal) connected with a plurality of stages, a wire (hereinafter also referred to as a low voltage wire) applying a low voltage, and a wire (hereinafter also referred to as a start signal wire) applying a start signal are formed will be described.

Figure 4:
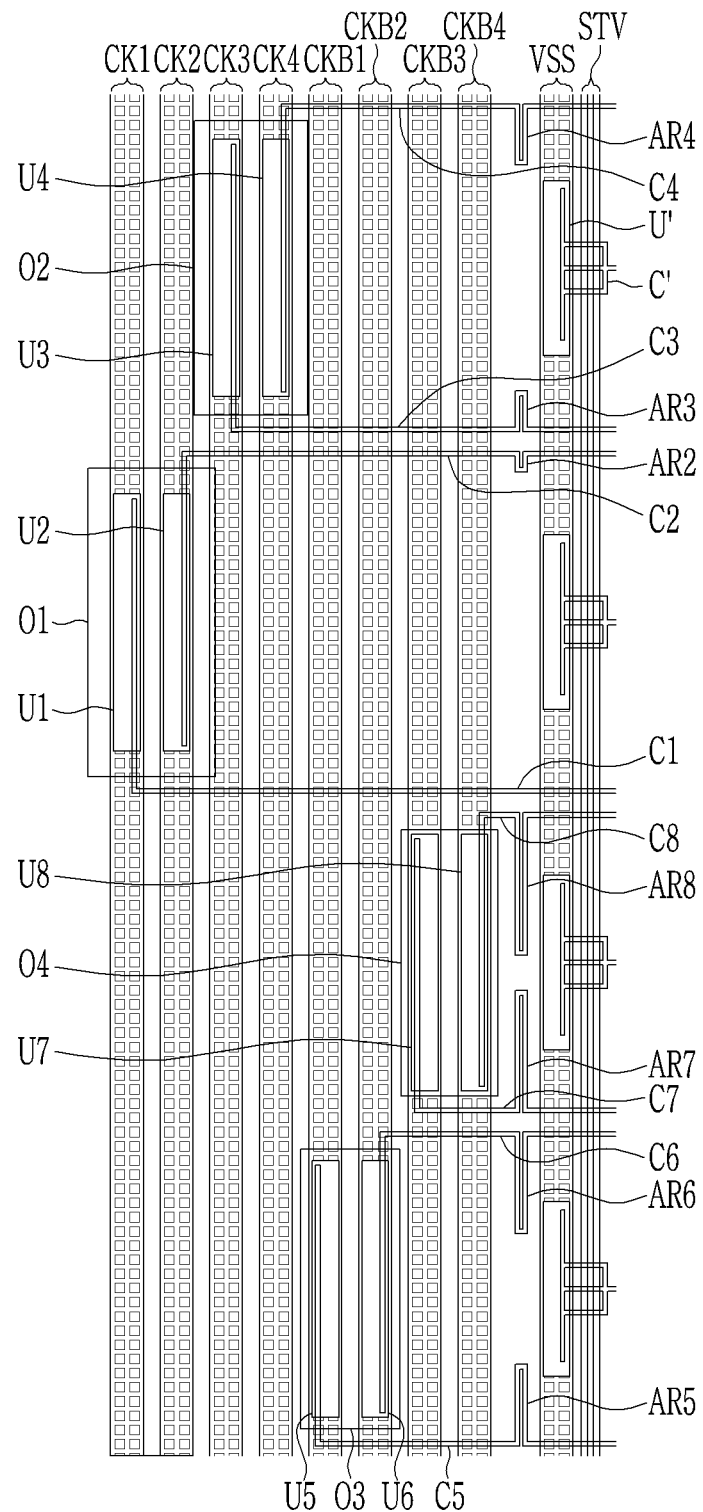
FIG. 4 is a top plan view of a wiring portion connected with the gate driver according to the exemplary embodiment.

FIG. 4 is a top plan view of a wiring portion connected with the gate driver according to the exemplary embodiment, and FIGS. 5A, 5B, 5C, and 5D are cross-sectional views of four first clock wiring connection portions shown in FIG. 4.

Referring to FIG. 4, the respective stages are disposed at right sides of four first clock wires CK1 to CK4, fourth second clock wires CKB1 to CKB4, a low voltage wire VSS, and four start signal wires STV, while being connected thereto.

The first clock wires CK1 to CK4, the second clock wires CKB1 to CKB4, the low voltage wire VSS, and the start signal wire STV extend in a vertical direction, and are formed in the same layer as a conductive layer (hereinafter referred to as a gate conductive layer) where the gate line and a gate electrode of the transistor are formed.

In FIG. 4, quadrangular-shaped openings are formed in the first clock wires CK1 to CK4, the second clock wires CKB1 to CKB4, and the low voltage wire VSS, and light such as UV is transmitted from therebelow through the openings such that a sealing member that may be disposed on the wiring portion can be cured. In the exemplary embodiment of FIG. 4, the opening is not formed in a portion (i.e., a clock wiring connection portion) where the respective wires are connected with a connection line of another line. However, depending on exemplary embodiments, the opening may be formed in the clock wiring connection portion.

The first clock wires CK1 to CK4 and the second clock wires CKB1 to CKB4 are connected with the respective stages through connection lines C1 to C8 and contact portions U1 to U8.

The connection lines C1 to C8 are formed in the same layer as a conductive layer (hereinafter referred to as a data conductive layer) where source/drain electrodes of the transistor are formed. Referring to FIG. 4, the connection lines C1 to C8 extend in a horizontal direction (also referred to as a first direction) and are then bent in the vertical direction (also referred to as a second direction) at the connected clock wires (first clock wires CK1 to CK4, second clock wires CKB1 to CKB4) and are thus overlapped with the clock wires. Each of the connection lines C1 to C8 comprises a first section extending in the first direction and a second section extending in the second direction bent from the first section, and the second section of each of the connection lines C1 to C8 overlaps with the connected clock wires.

The connection lines C1 to C8 bent in the vertical direction are electrically connected with the respective clock wires (first clock wires CK1 to CK4, second clock wires CKB1 to CKB4) through the contact portions U1 to U8.

Here, the contact portions U1 to U8 are formed in the same layer as a layer (hereinafter referred to as a pixel electrode layer) where the pixel electrode is formed.

Referring to FIGS. 5A-5D, insulation layers IL1 and IL2 are disposed between the gate conductive layer, the data conductive layer, and the pixel electrode layer. That is, the first insulation layer IL1 is disposed between the gate conductive layer and data conductive layer, and may also be called a gate insulation layer. In addition, the second insulation layer IL2 is disposed between the data conductive layer and the pixel electrode layer, and may also be called an organic insulator.

The two insulation layers IL1 and IL2 respectively include an opening that exposes the wires (first clock wires CK1 to CK4, second clock wires CKB1 to CKB4) and an opening that exposes connection lines C1 to C8, and exposed portions are connected to the contact portions U1 to U8 such that they are electrically connected with the wires (the first clock wires CK1 to CK4, the second clock wires CK1 to CK4).

Referring to FIGS. 5A-5D, a semiconductor layer is further formed below the data conductive layer (connecting line), which represents an exemplary embodiment in which the data conductive layer and the semiconductor layer are etched together using a transflective mask. In the display area DA, the semiconductor layer is disposed below the data conductive layer.

Among the structures shown in FIGS. 5A-5D, a connection structure will now be described in detail based on FIG. 5A.

The first insulation layer IL1 and the second insulation layer IL2 have a plurality of openings that respectively expose a portion of the first clock wire CK1, a portion of the second clock wire CK2, a portion of the first connection line C1, and a portion of the second connection line C2. The first contact portion U1 connects the first clock wire CK1 and the first connection line C1 through the openings that expose the portion of the first clock wire CK1 and the portion of the first connection line C1 to the first insulation layer IL1 and the second insulation layer IL2. In addition, the second contact unit U2 connects the second clock wire CK2 and the second connection line C2 to the first insulation layer IL1 and the second insulation layer IL2 through the openings that expose the portion of the second clock wire CK2 and the portion of the second connection line C2.

In addition to FIGS. 5A-5D, a common electrode CM and a light blocking member BM where openings O1 to O4 are formed are formed in the second substrate DS2

Figure 5A:
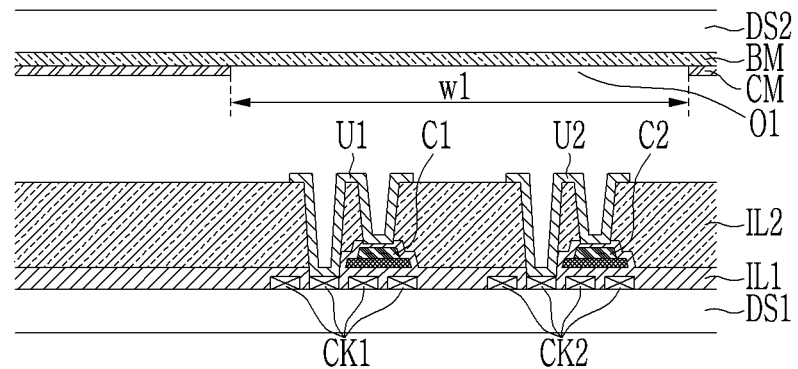
FIGS. 5A, 5B, 5C, and 5D are cross-sectional views of four first clock wiring connection portions shown in FIG. 4.
Figure 5B:
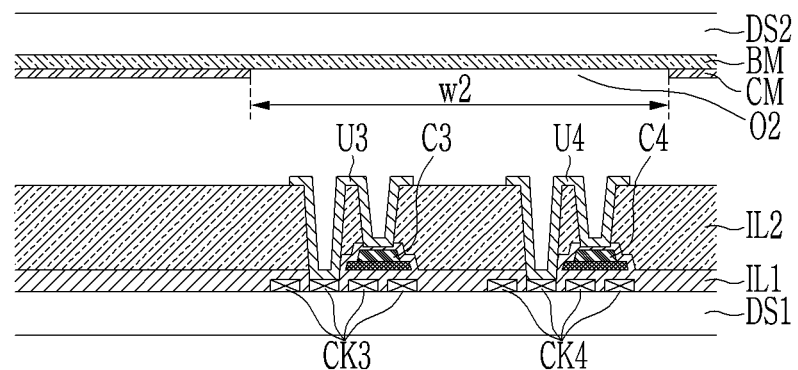
Figure 5C:
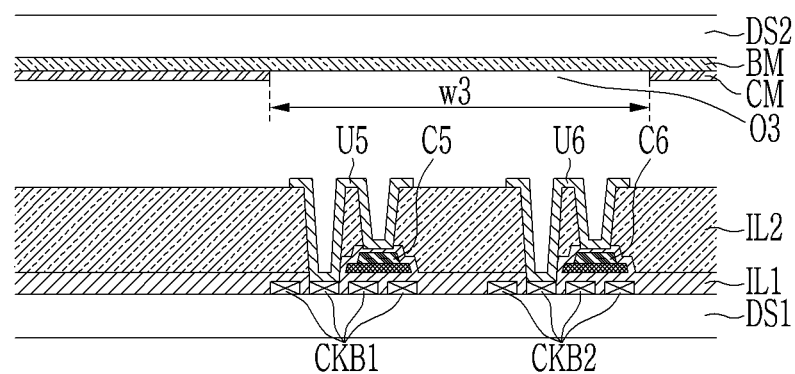
Figure 5D:
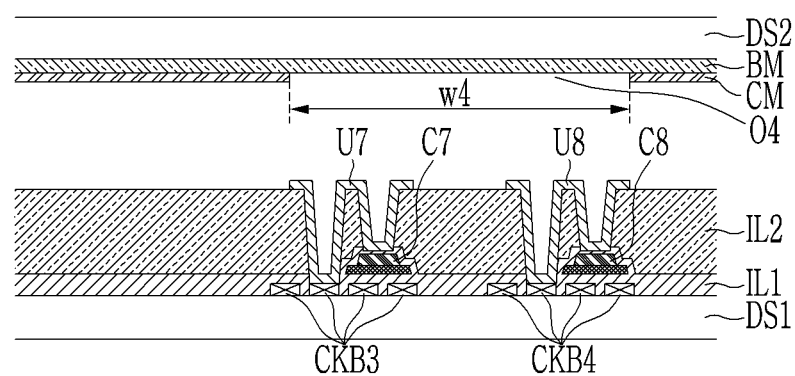

FIG. 55A-5D show a part of the non-display area NDA, where the light blocking member BM overlaps the common electrode CM and the openings O1 to O4.

Meanwhile, a color filter (not shown) is included in the display panel DP, and the color filter may be disposed in the first substrate DS1 or in the second substrate DS2. In the exemplary embodiment of FIG. 5A, the color filter may be formed in the first substrate DS1 of the display area DA.

Referring to FIG. 4 and FIGS. 5A-5D, the openings O1 to O4 are formed at portions of the common electrode CM of the second substrate DS2, corresponding to the positions of the contact portions U1 to U8, which are the clock wiring connection portions, on the first substrate DS1. In the present exemplary embodiment, one of the openings O1 to O4 is formed in every two contact portions of U1 to U8. That is, the first contact portion U1 and the second contact portion U2 are disposed horizontally adjacent to each other, and the first opening O1 is formed at a portion corresponding to the first contact portion U1 and the second contact portion U2 in the common electrode CM. The first opening O1 may have a larger planar area than the first contact portion U1 and the second contact portion U2, and may be larger than the sum of the first contact portion U1 and the second contact portion U2. As a result, the common electrode CM does not overlap the first contact portion U1 and the second contact portion U2 on the plane.

In FIG. 5B, the third contact portion U3 and the fourth contact portion U4 are disposed horizontally adjacent to each other, and the second opening O2 is formed at the portion corresponding to the third contact portion U3 and the fourth contact portion U4 on the common electrode CM. In FIG. 5C, the fifth contact portion U5 and sixth contact portion U6 are disposed horizontally adjacent to each other, and the third opening O3 is formed at a portion corresponding to the fifth contact portion U5 and the sixth contact portion U6 in the common electrode CM. In FIG. 5D, the seventh contact portion U7 and the eighth contact portion U8 are disposed horizontally adjacent to each other, and the fourth opening O4 is formed at the portion corresponding to the seventh contact portion U7 and the eighth contact portion U8 on the common electrode CM.

The openings O1 to O4 have a larger planar area than the contact portions U1 to U8, and the common electrode CM does not overlap the planar contact portions U1 to U8.

Each of the connection lines C1 to C8 overlaps with the common electrode CM or another wire to form parasitic capacitance. Referring to FIG. 4, since lengths of the connection lines C1 to C8 are different from each other, parasitic capacitances generated by the connection lines C1 to C8 are different from one another. That is, the connection lines C1 to C8 connected with the clock wire disposed far from the stage have a relatively large number of overlapping wires, and accordingly the parasitic capacitance value is large.

Such a difference in parasitic capacitance causes a problem that the clock signal and the clock bar signal input to each stage are not uniformly input to each stage.

In other words, each stage receives a constant clock signal and a clock bar signal, and operate it regularly so that gate signals are generated and operate properly. However, when the clock signal and the clock bar signal input to each stage are different in delay, the timing is shifted so that the gate signal outputted by each stage also causes a difference. This problem affects the display quality by changing the time the pixel is charged.

In order to eliminate such a problem, in the present exemplary embodiment, the openings O1 to O4 are formed to be different from each other in size in the common electrode CM to compensate for the difference in the parasitic capacitance between the connection lines C1 to C8 generated when connected with the clock wire having a distance difference from the stage.

Referring to FIG. 4, the first opening O1 is the largest, the second opening O2 is the second largest, the third opening O3 is the third largest, and the fourth opening O4 is the smallest. This is because, when being connected with a clock wire disposed away from the stage, large parasitic capacitance with the connection lines C1 to C8 is generated, and thus the size of the opening O1 to O4 connected with the remotely disposed clock wire is increased.

Meanwhile, in FIGS. 5A-5D, widths of the openings O1 to O4 are illustrated. That is, as shown in FIG. 5A, a width w1 of the opening O1 corresponding to the contact portion U1 and the second contact portion U2 is the widest, as shown in FIG. 5B, a width w2 of the opening O2 corresponding to the contact portion U3 and the contact portion U4 is the second widest, as shown in FIG. 5C, a width w3 of the opening O3 corresponding to the contact portion U5 and the contact portion U6 are the third widest, and as shown in FIG. 5D, a width w4 of the opening O4 corresponding to the contact portion U7 and the contact portion U8 is the most narrow.

In this way, a difference of the parasitic capacitance generated by each of the connection lines C1 to C8 becomes less than a predetermined level even when the connection line is connected with a remotely disposed clock wire by adjusting the size of the openings O1 to O4 such that a difference between a clock signal and a clock bar signal applied to each stage can be prevented or suppressed from occurring.

That is, the plurality of openings disposed in the common electrode CM may include at least two openings that are different in size, and the size of the opening is increased as a clock wire to which a clock wiring connection portion corresponding to the opening is farther away from the stage. However, depending on exemplary embodiments, two or more openings having the same size may be included, and this will be described later with reference to FIG. 13.

In the present exemplary embodiment, additional resistors AR2 to AR8 are further included to make a resistance difference according to a length difference of the connection lines C1 to C8 constant.

That is, referring to FIG. 4, the first connection line C1 has high resistance since it is the longest, and thus the first connection line C1 does not additionally include a resistor. However, the second connection line C2, which is the second longest, has an additional resistor AR2 to match the length of the first connection line C1, thereby having the same resistance. In this way, the additional resistors AR2 to AR8 of different lengths are additionally included so that the lengths of the connection lines C1 to C8 all match the length of the first connection line C1. As a result, the length of the additional resistor AR2 to AR8 is increased as the length of the connection lines C1 to C8 is shorter, and the longest first connection line C1 does not include the additional resistance unit.

In FIG. 4, the low voltage wire VSS includes a connection structure so as to be connected with each stage, and is connected with each stage through a connection line C' disposed in the data conductive layer and a contact portion U1' disposed in the pixel electrode layer. Here, the low voltage wire VSS is formed in the gate conductive layer. That is, the low voltage wire VSS of the gate conductive layer formed in a vertical direction is electrically connected with the connection line C' through the contact portion U' disposed in the pixel electrode layer, and the connection line C' extends to each stage in the data conductive layer.

Meanwhile, in FIG. 4, the start signal wire STV does not have an additional connection structure, and the start signal wire STV formed in the gate conductive layer is directly bent and thus connected with stages. However, the start signal wire STV may also have a connection structure like other wires. Here, the number of start signal wires STV may be the half the number of clock wires, and may be the same as the number of first clock wires and the number of second clock wires.

Hereinafter, a structure of the stage and an output waveform according to an exemplary embodiment will be described with reference to FIG. 6 and FIG. 7.

Figure 6:
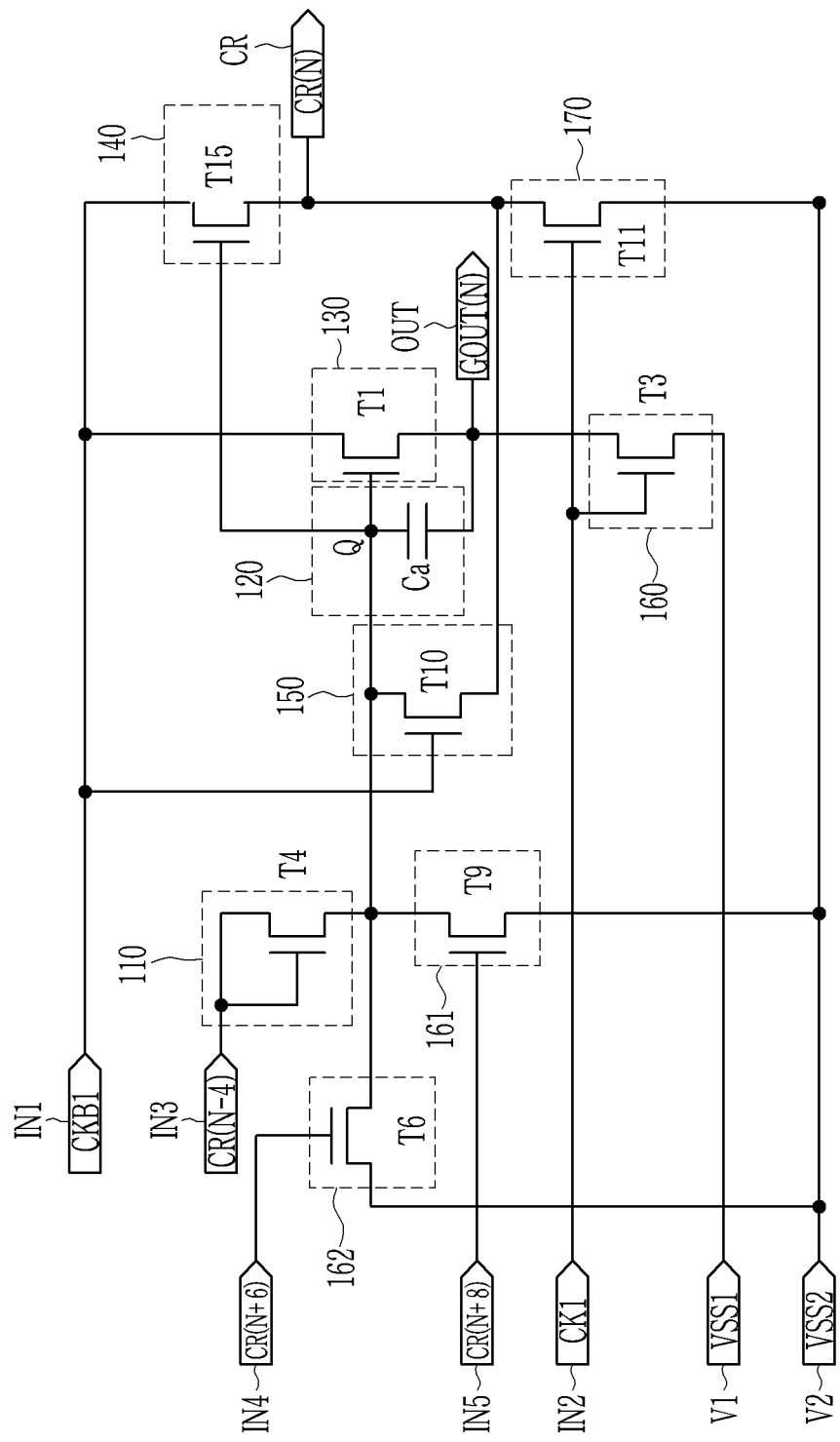
FIG. 6 is an equivalent circuit diagram of a stage according to an exemplary embodiment.
Figure 7:
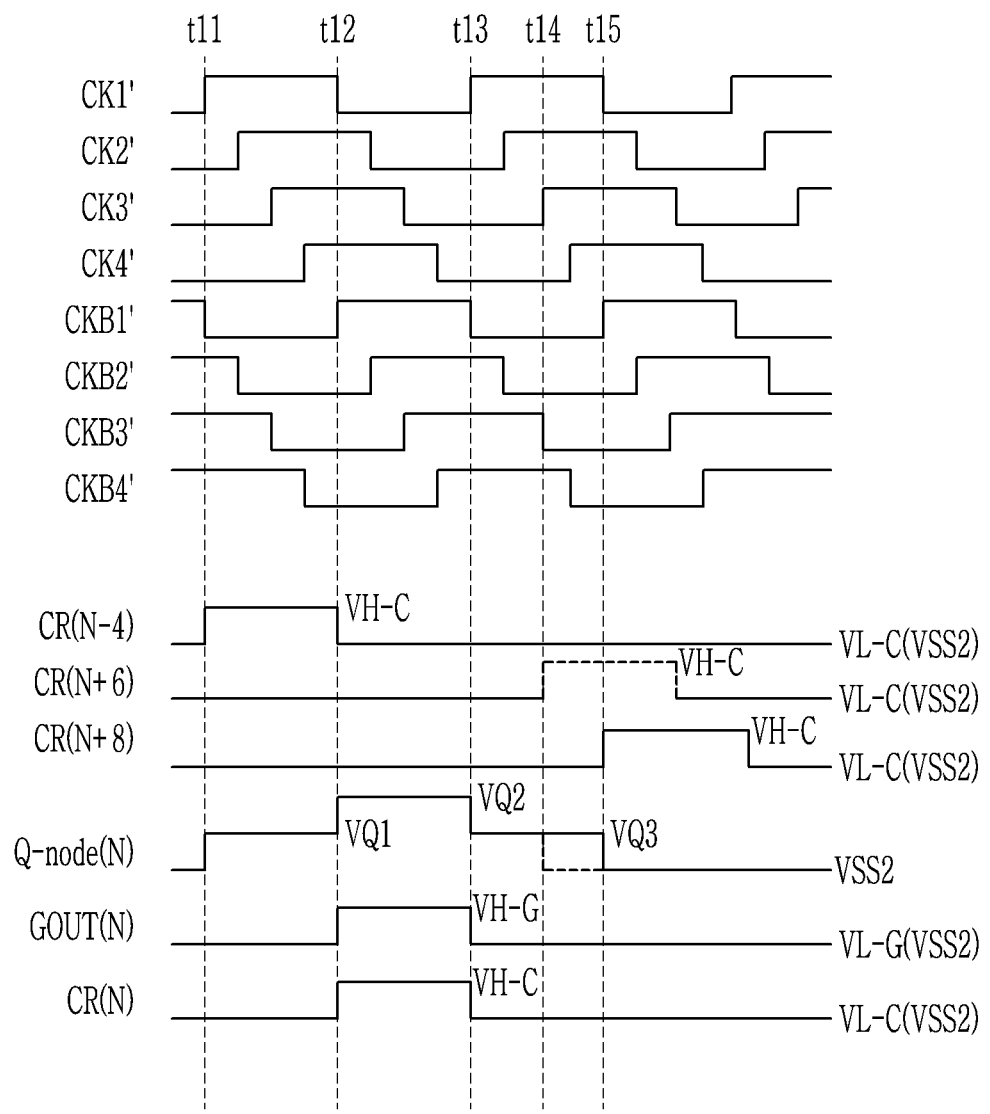
FIG. 7 is a waveform that shows an input signal and an output signal of the stage of FIG. 6.

FIG. 6 is an equivalent circuit diagram of a stage according to an exemplary embodiment, and FIG. 7 is a waveform that shows an input signal and an output signal of the stage of FIG. 6.

A gate driver 100 receives clock signals CK1' to CK4', clock bar signals CKB1' to CKB4', start signals STV1 to STV4, a first low voltage, and a second low voltage. The gate driver 100 outputs a gate signal.

One of the clock signals CK1' to CK4' and one of the clock bar signals CKB1' to CKB4' are applied to a first input terminal Ni and a second input terminal IN2 of one stage. The first low voltage is applied to a first voltage terminal V1 of the stage and the second low voltage is applied to a second voltage terminal V2 of the stage. A carry signal is output from a carry terminal CR of the stage. The gate signal is output from a gate output terminal OUT of each of the stages.

The clock signals CK1' to CK4' and the clock bar signals CKB1' to CKB4' are square wave signals that repeat an enable level and a disable level. A duty ratio of the clock signals CK1' to CK4' and the clock bar signals CKB1' to CKB4' may be 50%. An enable level of the clock signals CK1' to CK4' and the clock bar signals CKB1' to CKB4' may have a gate-on voltage level.

The low levels of clock signals CK1' to CK4' and clock bar signals CKB1' to CKB4' may have a first low voltage level or a second low voltage level. Both the first low voltage and the second low voltage may be DC voltages. The second low voltage may have a lower level than the first low voltage.

Referring to FIG. 7, an N-th stage ST(N) is driven in response to a carry signal of one of the previous stages (e.g., a signal output from CR(N−4)). The signal or clock bar signal (e.g., CKB1') is output as a gate-on voltage level gate signal GOUT(N) and a carry signal. The Nth stage ST(N) lowers a voltage level of the gate signal GOUT(N) to a first low voltage in response to the clock signal or the clock bar signal (e.g., CK1'), and the voltage level of the carry signal to a second low voltage.

In such a method, the first stage to the last stage sequentially output gate signals.

The N-th stage ST(N) includes a pull-up controller 110, a charging portion 120, a pull-up portion 130, a carry portion 140, a first holding portion 150, a first pull-down portion 160, a second pull-down portion 161, a third pull-down portion 162, and a carry pull-down portion 170.

The pull-up controller 110 includes a fourth transistor T4. The fourth transistor T4 includes a gate and a first end that are connected to the third input terminal IN3, and a second end connected to a first node Ql. A carry signal output from a previous stage ST(N−4) disposed previous to a (1*k)th stage, for example, a carry signal output from a carry terminal of the (N−4)th stage, is input to the third input terminal IN3.

The charging portion 120 includes a charging capacitor Ca. The charging capacitor Ca includes a first electrode connected to the first node Q and a second electrode connected to the gate output terminal OUT.

The pull-up portion 130 outputs a signal input to the first input terminal Ni as the gate signal GOUT(N) in response to the signal applied to the first node Q.

The pull-up portion 130 includes a first transistor Ti. The first transistor Ti includes a gate connected to the first node Q, a first end connected to the first input terminal IN1, and a second end connected to the gate output terminal OUT. In the exemplary embodiment, the pull-up portion 130 outputs a clock bar signal CKB1 input to the first input terminal Ni as the gate signal GOUT(N).

The carry portion 140 outputs the signal input to the first input terminal IN1 as a carry signal in response to the signal applied to the first node Q.

The carry portion 140 includes a fifteenth transistor T15. The fifteenth transistor T15 includes a gate connected to the first node Q, a first end connected to the first input terminal IN1, and a second end connected to the carry terminal CR. In the exemplary embodiment, the carry portion 140 outputs the clock bar signal CKB1' as the carry signal.

The first holding portion 150 connects the first node Q and the carry terminal CR in response to the signal input to the first input terminal Ni to hold the voltage level of the first node Q.

The first holding portion 150 includes a tenth transistor T10. The tenth transistor T10 includes a gate connected to the first input terminal IN1, a first end connected to the first node Q, and a second end connected to the carry terminal CR.

The first pull-down portion 160 pulls down the voltage level of the gate output terminal OUT to the first low voltage in response to a signal input to the second input terminal IN2. In the exemplary embodiment, the clock bar signal CKB1' and a clock signal CK1' are input to the second input terminal IN2.

The first pull-down portion 160 includes a third transistor T3. The third transistor T3 includes a gate connected to the second input terminal IN2, a first end connected to the gate output terminal OUT, and a second end connected to a first voltage terminal V1.

The second pull-down portion 161 pulls down the voltage level of the first node Q to the second low voltage in response to the signal input to the fifth input terminal IN5.

The second pull-down portion 161 includes a ninth transistor T9. The ninth transistor T9 includes a gate connected to the fifth input terminal IN5, a first end connected to the second voltage terminal V2, and a second end connected to the first node Q. A carry signal output from a stage (e.g., including ST(N+8), ST(N+12), and the like) disposed next to the (i*k)th stage, for example, a carry signal output from a carry terminal of the (N+8)th stage, is input to the fifth input terminal IN5.

In addition to this, the second pull-down portion 161 may include two transistors, each of which has a gate connected to the fifth input terminal IN5, and are connected in series between a second voltage terminal V2 and the first node Q.

The third pull-down portion 162 pulls down the voltage level of the first node Q to the second low voltage in response to the signal input to the fourth input terminal IN4.

Third pull-down portion 162 includes a sixth transistor T6. The sixth transistor T6 includes a gate connected to the fourth input terminal IN4, a first end connected to the second voltage terminal V2, and a second end connected to the first node Q. A carry signal outputted by a next stage (including ST(N+5), ST(N+6), ST(N+7), and the like) disposed after the j-th stage, for example, a carry signal output from a carry terminal of the (N+6)th stage, is input to the fourth input terminal IN4.

The carry pull-down portion 170 pulls down the voltage level of the carry terminal CR to a second low voltage in response to the signal input to the second input terminal IN2.

The carry pull-down portion 170 includes an eleventh transistor T11. The eleventh transistor T11 includes a gate connected to the second input terminal IN2, a first end connected to the second voltage terminal V2, and a second end connected to the carry terminal CR.

Referring to FIG. 7, at t11, a carry signal output from a carry terminal of the (N−4)th stage ST(N−4) becomes the enable level. Then, a voltage level of the first node Q is increased to a first level VQ1, and a voltage corresponding to the carry signal is charged in the charging capacitor Ca.

At t12, the clock bar signal CKB1' becomes the enable level. Then, the voltage level of the first node Q is boosted to a second level VQ2 from the first level VQ1. Since the potential of the first node Q is maintained at the second-high level VQ2, the gate signal GOUT (N) may be output as a high level VH-G. The carry signal may be output as a high level VH-C. Here, high levels VH-G and VH-C may have the same level as the enable level of the clock bar signal CKB1'.

At t13, the clock signal CK1' becomes the enable level, and the clock bar signal CKB1' becomes the disable level. The potential of the first node Q decreases to the third level VQ3 by the clock bar signal CKB1' of the disable level. The third transistor T3 and eleventh transistor T11 are turned on and thus a first low voltage is applied to the output terminal OUT and a second low voltage to the carry terminal CR(N) by the enable level clock signal CK1' such that output of the gate signal GOUT(N) of the high level VH-G and the carry signal of the high level VH-C are stopped.

At t14, the clock signal CK3' becomes the enable level. Then, a carry signal of the (N+6)th stage ST(N+6), having the high level VH-C, is input to the fourth input terminal IN4 of the N-th stage ST(N). Then, the sixth transistor T6 is turned on by the carry signal of the high level VH-C of the (N+6)th stage ST(N+6), and thus the voltage level of the first node Q is pulled down to the second low voltage.

According to the present exemplary embodiment, the first node Q may also be pulled down by a ninth transistor T9. At t15, a carry signal generated in a stage receiving a carry signal from the N-th stage ST(N) may be applied to a gate of the ninth transistor T9. Therefore, even before the (N+6) th stage ST(N6) is driven by the high level carry signal output by stages normally operated by the start signals STV1 to STV4 to output the high level (N+6)th carry signal, the gate signal and the carry signal can be prevented or suppressed from being output from the N-th stage ST(N). As a result, according to the exemplary embodiment, reliability of the gate driver can be improved, and display quality of the display panel DP can be improved.

Hereinabove, the exemplary embodiment in which a total of 8 clock wires (four first clock wires CK1 to CK4 and four second clock bar wires CKB1 to CKB4) are included has been described. Hereinafter, an exemplary embodiment in which a total of 12 clock wires (six first clock wires CK1 to CK6 and six second clock bar wires CKB1 to CKB6) will be described.

Figure 8:
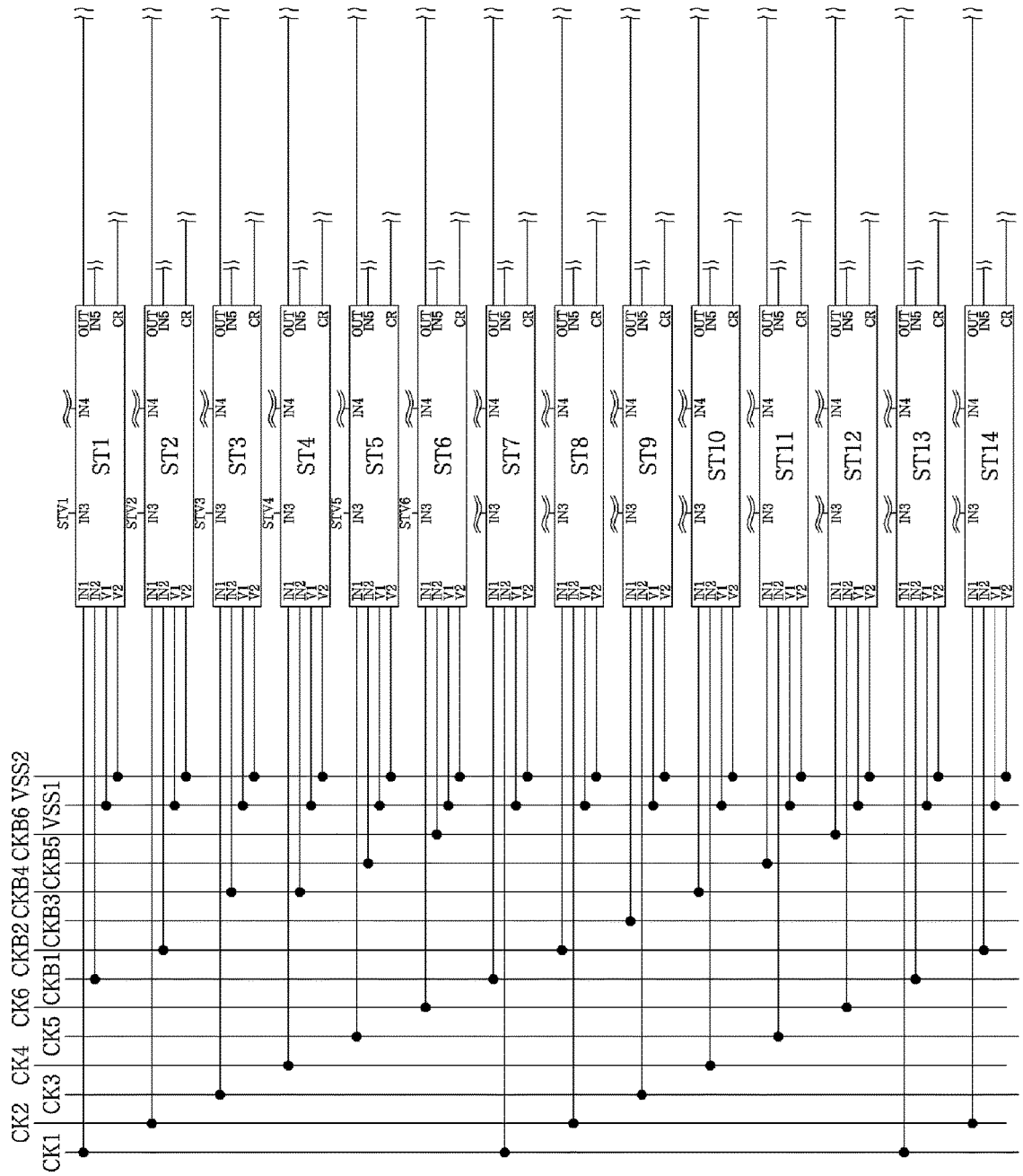
FIG. 8 is a block diagram of a connection relationship between a plurality of stages and a wiring portion of a gate driver.
Figure 9:
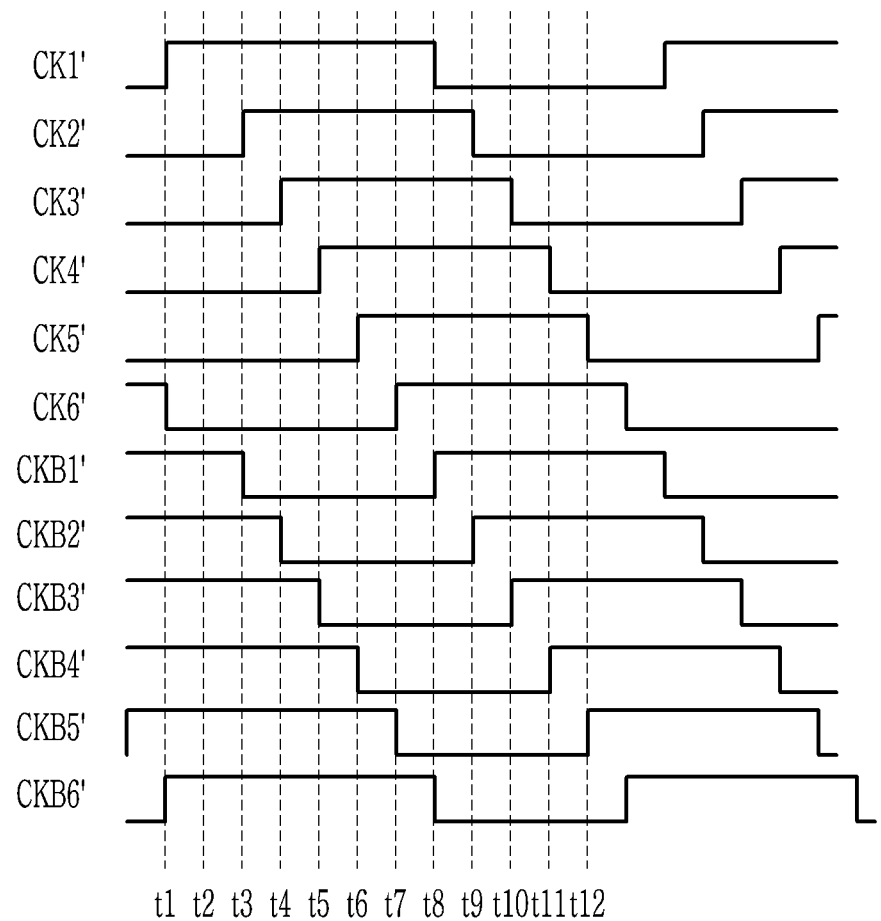
FIG. 9 is a waveform diagram of clock signals applied to the gate driver of FIG. 8.
Figure 10:
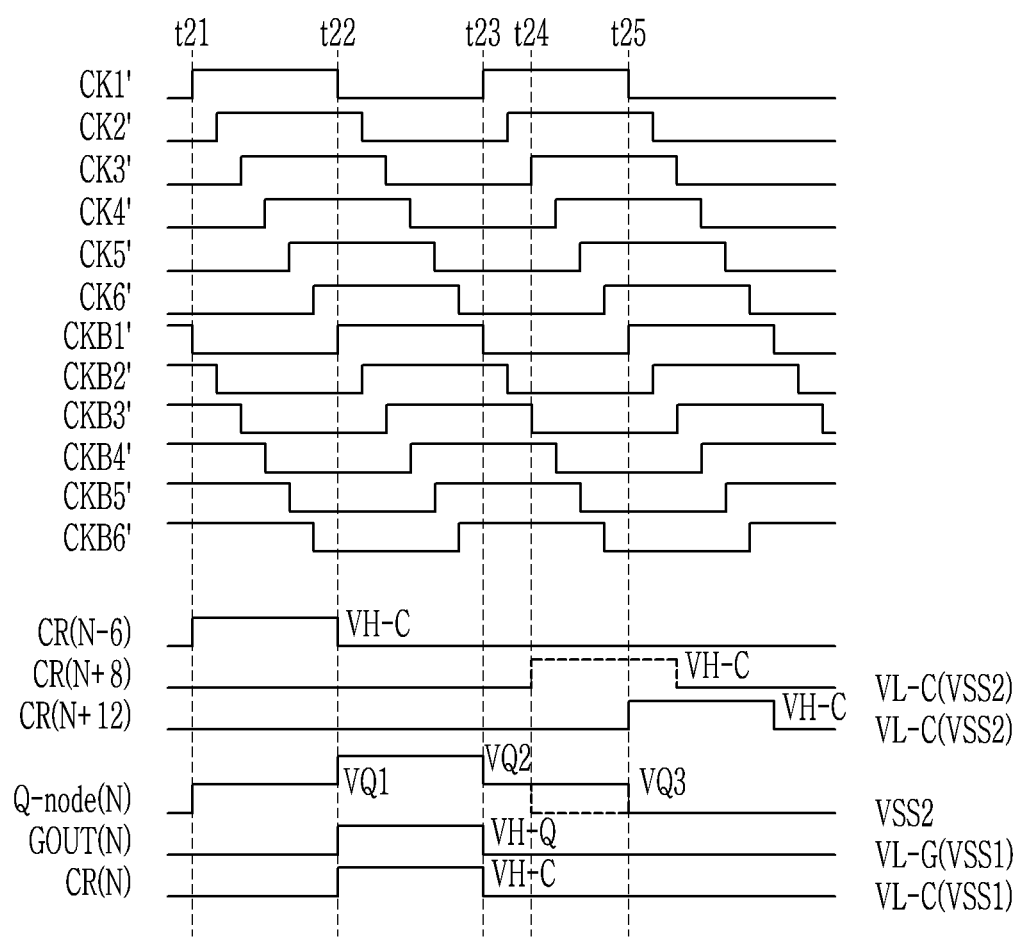
FIG. 10 is a waveform diagram of an input signal and an output signal of a stage.

FIG. 8 is a block diagram of a connection relationship between a plurality of stages and a wiring portion of a gate driver, FIG. 9 is a waveform diagram of clock signals applied to the gate driver of FIG. 8, and FIG. 10 is a waveform diagram of an input signal and an output signal of a stage.

FIG. 8, FIG. 9, and FIG. 10 correspond to FIG. 2, FIG. 3, and FIG. 7, and different parts will be mainly described.

Total 12 clock wires and each stage used in the exemplary embodiment of FIG. 8 have the following relationship.

A clock signal CK1 and the clock bar signal CKB1', which is an antiphase to the clock signal CK1, may be input to the first stage ST1 and the seventh stage ST7, A clock signal CK2', which is shifted by 1/12 of the clock signal CK1', and a clock bar signal CKB2', which has an antiphase with respect to the clock signal CK2', may be input to a second stage ST2, which is the next stage of the first stage ST1, and an eighth stage ST8, which is the next stage of the seventh stage ST7. A clock signal CK3', which is shifted by 1/12 of the clock signal CK2', and a clock bar signal CKB3', which has an antiphase with respect to the clock signal CK3', may be input to a third stage ST3, which is the next stage of the second stage ST2, and a ninth stage ST9, which is the next stage of the eighth stage ST8. A clock signal CK4', which is shifted by 1/12 of the clock signal CK3', and a clock bar signal CKB4', which has an antiphase with respect to the clock signal CK3', may be input to a fourth stage ST4, which is the next stage of the third stage ST3, and a tenth stage ST10, which is the next stage of the ninth stage ST9. A clock signal CK5', which is shifted by 1/12 of the clock signal CK4', and a clock bar signal CKB5', which has an antiphase with respect to the clock signal CK4', may be input to a fifth stage ST5, which is the next stage of the fourth stage ST4, and an eleventh stage ST11, which is the next stage of the tenth stage ST10. A clock signal CK6', which is shifted by 1/12 of the clock signal CK5', and a clock bar signal CKB6', which has an antiphase with respect to the clock signal CK5', may be input to a sixth stage ST6, which is the next stage of the fifth stage ST5, and an twelfth stage ST12, which is the next stage of the eleventh stage ST11. Stages after the twelfth stage ST12 are connected with one of clock signals CK1' to CK6' and one of clock bar signals CKB1' to −CKB6' in the same manner as described above.

In FIG. 8, inputs to the third input terminal IN3, the fourth input terminal IN4, and the fifth input terminal IN5 are not illustrated in detail, and referring to FIGS. 12A, 12B, 12C, 12D, 12E, and 12F, in the present exemplary embodiment, a carry signal may be received from a stage disposed six stages before through the third input terminal IN3, a carry signal may be received from a stage after 8 stages through the fourth input terminal IN4, and a carry signal may be received from a stage after 12 stages through the fifth input terminal IN5.

When a signal of the waveform of FIG. 9 is provided to the stages that are connected as described above, each stage may output a carry signal and a gate signal with the waveform shown in FIG. 10. Here, the structure of the stage may be the same as shown in FIG. 6.

As shown in FIG. 10, a stage ST(N) of a gate driver 100 may receive a previous carry signal, a first next carry signal, and a second next carry signal. That is, the previous carry signal may be input to a third input terminal IN3 of the stage ST(N) of the gate driver 100, the first next carry signal may be input to the fourth input terminal IN4, and the second next carry signal may be input to the fifth input terminal IN5. In addition, the stage ST(N) may transmit a carry signal to a third input terminal IN3 of an (N+4)th stage ST(N+4) through a carry terminal CR.

The previous carry signal may be a carry signal output from a previous stage ST(N−6) disposed sixth from the current stage ST(N). Here, the stage applying the previous carry signal may be a stage that precedes the number of clock signals having the enable level while one clock signal is the enable level. The previous stage ST(N−6) may receive the same clock signal and clock bar signal as the current stage ST(N).

The first next carry signal may be a next stage to be disposed eighth from the current stage ST(N), and the second next carry signal may be a next stage disposed twelfth from the current stage ST(N). The second next stage ST(N+12) may receive the same clock signal and the same clock bar signal as the current stage ST(N). Depending on exemplary embodiments, the first next carry signal may be applied from one of next twelve stages excluding the sixth stage among them, and the second next carry signal may be applied from one of next twelve stages excluding the first stage among them.

The gate driver 100 receive clock signals CK1' to CK6', clock bar signals CKB1' to CKB6', start signals STV1 to STV6, a first low voltage, and a second low voltage. The gate driver 100 outputs a gate signal.

The clock signals CK1' to CK6' and the clock bar signals CKB1' to CKB6' are applied to first input terminals Ni and second input terminals IN2 of the respective stages. The first low voltage is applied to a first voltage terminal V1 of each stage, and the second low voltage is applied to a second voltage terminal of each stage. The carry signal is output from the carry terminal CR of each stage. The gate signal is output from the gate output terminal OUT of each stage.

The n-th stage ST(N) is driven in response to a carry signal of one of previous stages (e.g., CR(N−6)), and outputs a clock signal or a clock bar signal (e.g., CKB1) as a gate signal GOUT(N) of a gate-on voltage level and a carry signal. The N-th stage ST(N) lowers a voltage level of the gate signal GOUT(N) to a first low voltage and a voltage level of the carry signal to a second low voltage in response to the clock signal or clock bar signal (e.g., CK1).

With such a method, the first stage to the last stage sequentially output the respective gate signals.

As shown in FIG. 6, the N-th stage ST(N) may include a pull-up controller 110, a charging portion 120, a pull-up portion 130, a carry portion 140, a first holding portion 150, a first pull-down portion 160, a second pull-down portion 161, a third pull-down portion 162, and a carry pull-down portion 170. However, signals applied from the pull-up controller 110, the second pull-down portion 161, and the third pull-down portion 162 are different from the signals shown in FIG. 6.

Referring to FIG. 10, at t21, a carry signal output from a carry terminal of an (N−6)th stage ST(N−6) becomes the enable level. Then, the voltage level of the first node Q is increased to the first level VQ1. The charging capacitor Ca is charged with a voltage corresponding to the carry signal.

At t22, the clock bar signal CKB1' becomes the enable level. Then, the voltage level of the first node Q is boosted to the second level VQ1 from the first level VQ1. Since the potential of the first node Q is maintained at the second level VQ2, the gate signal GOUT(N) may be output at the high level VH-G. The carry signal may be output at the high level VH-C. Here, high levels VH-G and VH-C may have the same level as the enable level of the clock bar signal CKB1'.

At t23, the clock signal CK1' becomes the enable level, and the clock bar signal CKB1' becomes the disable level. The potential of the first node Q is reduced to the third level VQ3 by the disable level clock bar signal CKB1'. The third transistor T3 and the eleventh transistor T11 are turned on by the enable level clock signal CK1', and thus a first low voltage is applied to the output terminal OUT and a second low voltage is output to the carry terminal CR(N) such that output of the gate signal GOUT(N) of the high level VH-G and the carry signal of the high level VH-C are stopped.

At t24, the clock signal CK3' becomes the enable level. Then, a carry signal of the high level VH-C of an (N+8)th stage ST(N+8) is input to the fourth input terminal IN4 of the N-th stage ST(N). Then, the sixth transistor T6 is turned on by the carry signal of the high level VH-C of the (N+8)th stage ST(N+8), and the voltage level of the first node Q is pulled down to the second low voltage.

Through such an operation, the carry signals and the gate signals shown in FIG. 10 are output.

Hereinafter, a structure of a wiring portion and a structure for compensating a capacitance difference or a resistance difference according to a length of connection lines C1 to C12 in a case of using 12 clock wires will be described with reference to FIG. 11 and FIG. 12.

Figure 11:
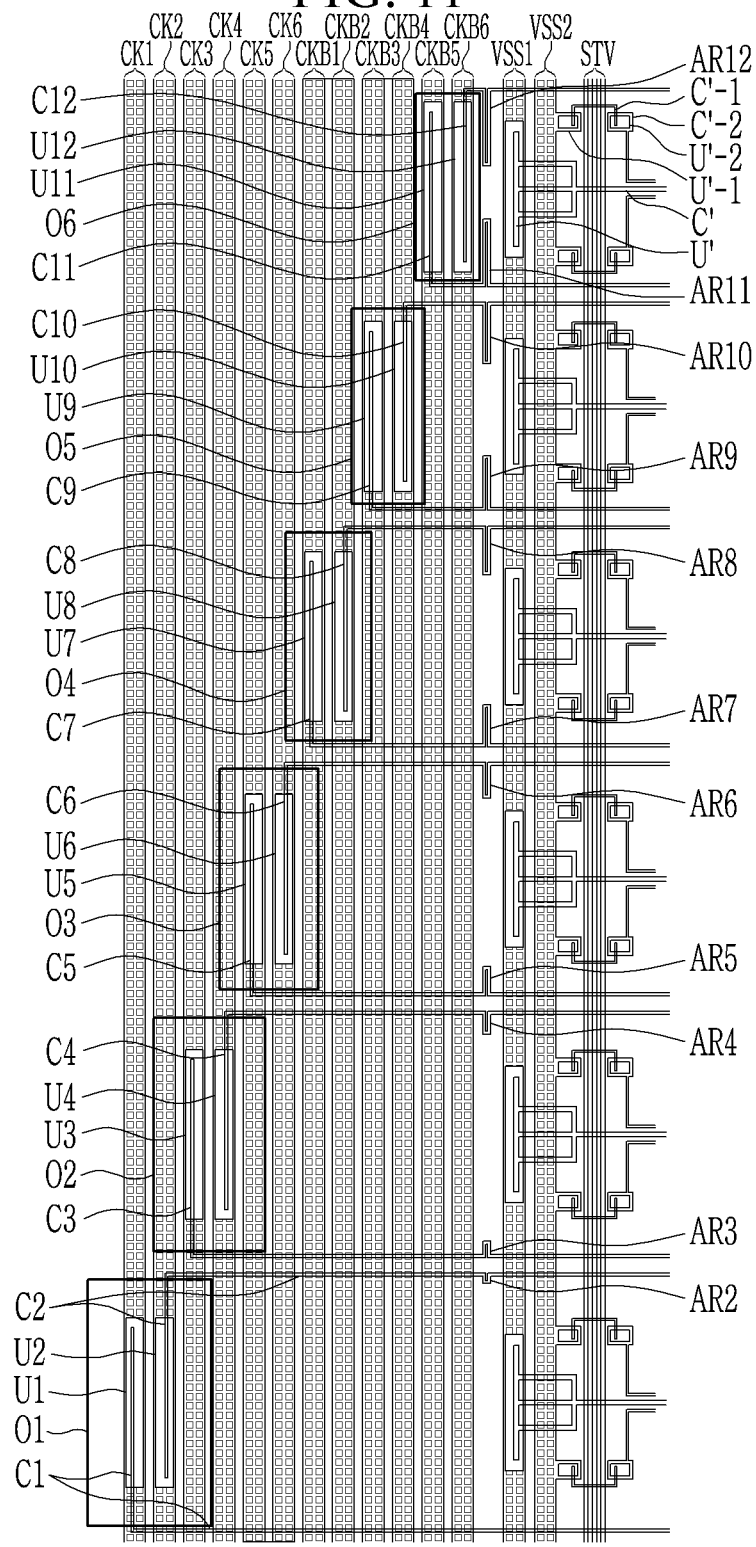
FIG. 11 is a top plan view of a wiring portion connected with a gate driver according to another exemplary embodiment.

FIG. 11 is a top plan view of a wiring portion connected with a gate driver according to another exemplary embodiment, and FIG. 12 is a cross-sectional view of six first clock wiring connection portions shown in FIG. 11.

Structures shown in FIG. 11 and FIG. 12 correspond to those of FIG. 4 and FIGS. 5A-5D, and different parts will be mainly described.

Rather than as shown in FIG. 4 and FIGS. 5A-5D, structures shown in FIG. 11 and FIGS. 12A, 12B, 12C, 12D, 12E, and 12F include a total of 12 clock wires (six first clock wires CK1 to CK6 and six second clock wires CKB1 to CKB6) and two low voltage wires VSS1 and VSS2. In addition, six start signal wires STV may be formed.

Since the clock wires include twelve clock wires, twelve connection lines C1 to C12 and twelve contact portions U1 to U12 are formed, and six openings O1 to O6 are formed in a common electrode CM.

A structure in which the clock wires are connected with the connection lines through the contact portions is shown in FIGS. 12A, 12B, 12C, 12D, 12E, and 12F, which is the same as that of FIGS. 5A-5D.

Among the six openings O1 to O6, a first opening O1 has the largest size and a sixth opening O6 has the smallest size to reduce a parasitic capacitance difference caused by lengths of the twelve connection lines C1 to C12. This is because the length of the connection lines C1 to C12 are increased as disposed farther away from a stage and thus the parasitic capacitance is increased, so the size of the corresponding opening O1 to O6 is increased as the length of the connection line C1 to C12 is increased to thereby reduce the parasitic capacitance. However, according to the exemplary embodiment, two or more openings having the same opening size may be included, and this will be described with reference to FIG. 13.

Figure 12A:
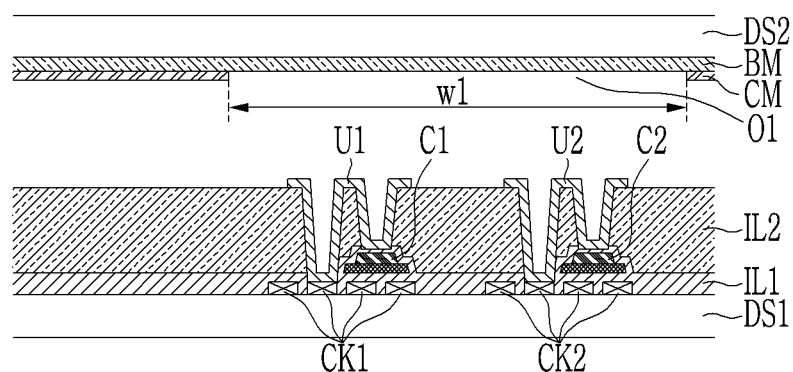
FIGS. 12A, 12B, 12C, 12D, 12E, and 12F are cross-sectional views of six first clock wiring connection portions shown in FIG. 11.
Figure 12B:
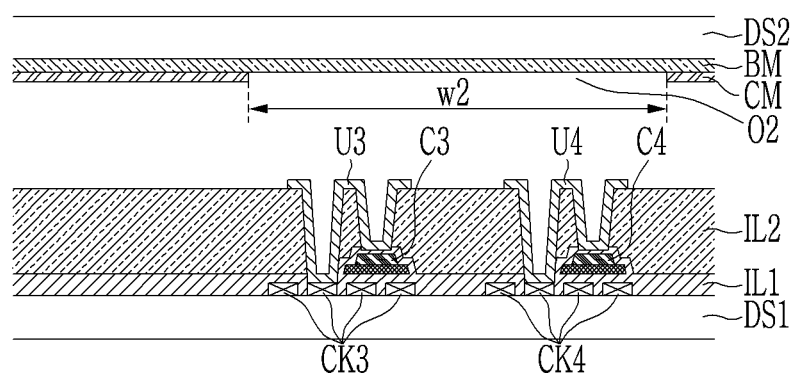
Figure 12C:
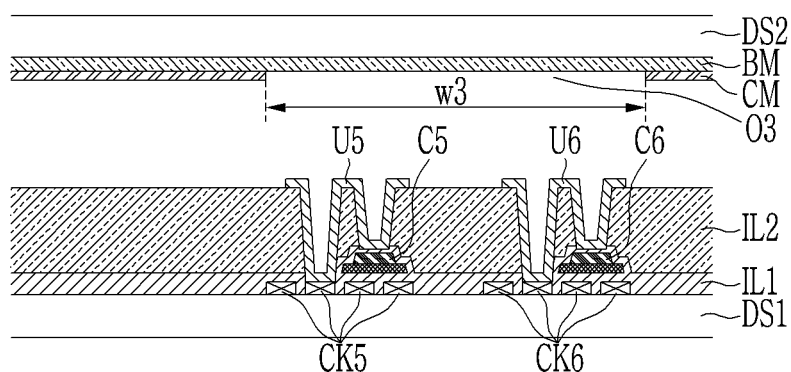
Figure 12D:
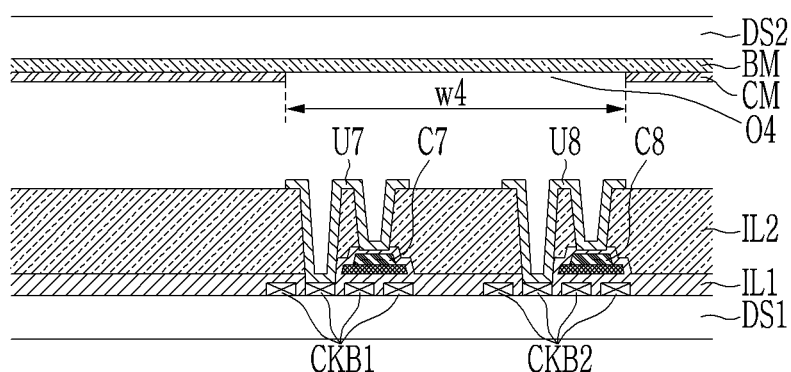
Figure 12E:
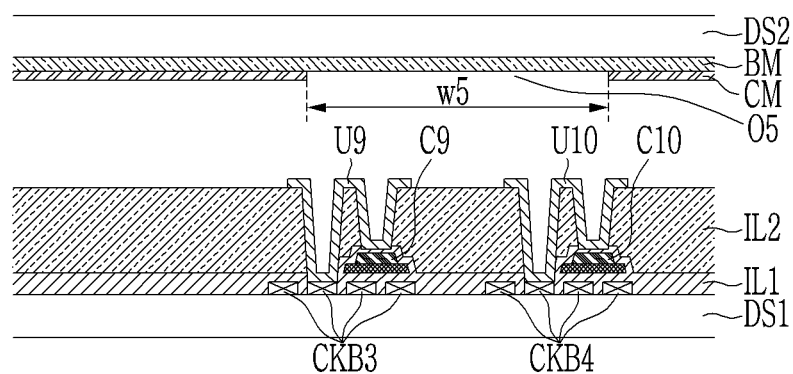
Figure 12F:
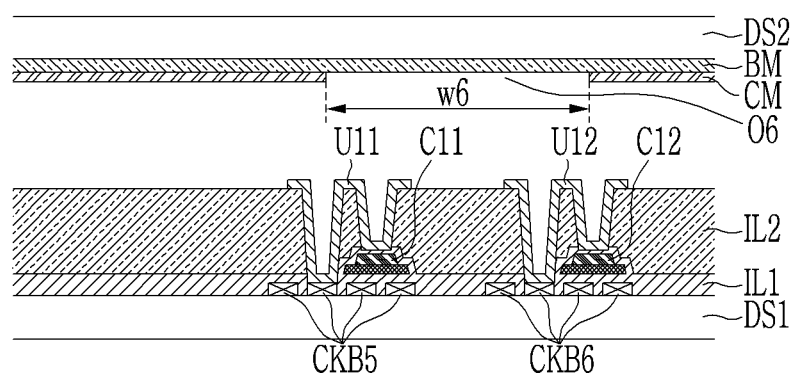

Meanwhile, in FIGS. 12A, 12B, 12C, 12D, 12E, and 12F, widths of the openings O1 to O6 are illustrated. That is, as shown in FIG. 12A, a width w1 of the opening O1 corresponding to a contact portion U1 and a contact portion U2 is the largest, as shown in FIG. 12B, a width w2 of the opening O2 corresponding to a contact portion U3 and a contact portion U4 is the second largest, as shown in FIG. 12C, a width w3 of the opening O3 corresponding to a contact portion U5 and a contact portion U6 is the third largest, as shown in FIG. 12D, a width w4 of the opening O4 corresponding to a contact portion U7 and a contact portion U8 is the fourth largest, as shown in FIG. 12E, a width w5 of the opening O5 corresponding to a contact portion U9 and a contact portion U10 is the fifth largest, and as shown in FIG. 12F, a width w6 of the opening O6 corresponding to a contact portion U11 and a contact portion U12 is the smallest.

In this way, a difference of the parasitic capacitance generated by each of the connection lines C1 to C8 becomes less than a predetermined level even when the length of the connection line C1 to C2 is increased by adjusting the size of the openings O1 to O4 such that a difference between a clock signal and a clock bar signal applied to each stage can be prevented or suppressed from occurring.

In addition, in the exemplary embodiment of FIG. 11, additional resistors AR2 to AR12 are further included to make a resistance difference according to a length difference of the connection lines C1 to C12 constant.

That is, referring to FIG. 11, since the first connection line C1 connects the furthest clock wire, the length becomes long, thereby causing high resistance. Therefore, in the present exemplary embodiment, the first connection line C1 does not include an additional resistor. However, the second connection line C2, which is the second furthest, has an additional resistor AR2 to match the length of the first connection line C1, thereby having the same resistance. In this way, the additional resistors AR2 to AR12 of different lengths are additionally included so that the lengths of the connection lines C1 to C8 all match the length of the first connection line C1. As a result, the length of the additional resistors AR1 to AR12 is increased as the clock wires to which the connection lines C1 to C12 are connected are closer to the stage, and the longest first connection line C1 may not include an additional resistor.

In FIG. 11, a connection structure of the first low voltage wire VSS1 is the same as that of FIG. 4. However, a connection structure of the second low voltage wire VSS2 of FIG. 11 is slightly different from that of FIG. 4. In the connection structure of the second low voltage wire VSS2, the second low voltage wire VSS2 includes protrusions. A protrusion of the second low voltage wire VSS2 is electrically connected with a connection line C'-1 through a contact portion U'-1. The connection line C'-1 extends such that a second end thereof is disposed above a connection line C'-2. Here, the connection line C'-1 is disposed in a data conductive layer, and the connection line is disposed in a gate conductive layer. The connection line C'-1 and the connection line C'-2 are connected with each other through a contact portion U'-2. The connection line C'-2 is bent and thus connected with a stage.

Meanwhile, in FIG. 11, a start signal wire STV does not have an additional connection structure, and the start signal wire STV formed in the gate conductive layer is directly bent and thus connected with stages. However, the start signal wire STV may also have a connection structure like other wires. Here, the start signal wire STV may include six start signal wires STV.

Hereinabove, the exemplary embodiment in which a total of 12 clock wires are included has been described with reference to FIG. 8, FIG. 9, FIG. 10, FIG. 11, and FIGS. 12A, 12B, 12C, 12D, 12E, and 12F. Meanwhile, referring to FIG. 1, FIG. 2, FIG. 3, FIG. 4, FIGS. 5A-5D, FIG. 6, and FIG. 7, the exemplary embodiment in which a total of 8 clock wires are included has been described, but the number of clock wires is not restrictive. That is, depending on exemplary embodiments, 16 clock wires may be included, and in this case, the number of first clock wires to which a clock signal is applied is eight, and the number of second clock wires to which a clock bar signal is applied is eight. In this as well, openings are formed above the clock wires, that is, in a common electrode, and parasitic capacitance generated due to a connection line connected to each stage in the clock wire may be formed within a constant range by changing the size of the opening. In addition, the connection line may be formed with an additional resistor to make the resistance constant.

The number of clock wires may be an even number because a pair of clock signals and clock bar signals may be applied, and various numbers of clock wires not mentioned above may be formed.

In the above, the exemplary embodiment in which the opening corresponding to the connection lines connected with the clock wire located far from the stage is largely formed has been mainly described. However, depending on exemplary embodiments, a case where the opening sizes of at least some of the openings are the same may be included as an exemplary embodiment. In such a case, the openings may be formed with the same size because a difference of overlapping parasitic capacitance is minute in the exemplary embodiment.

Hereinafter, an exemplary variation of the exemplary embodiment of FIG. 4 and FIGS. 5A-5D will be described with reference to FIG. 13 and FIGS. 14A, 14B, 14C, and 14D.

Figure 13:
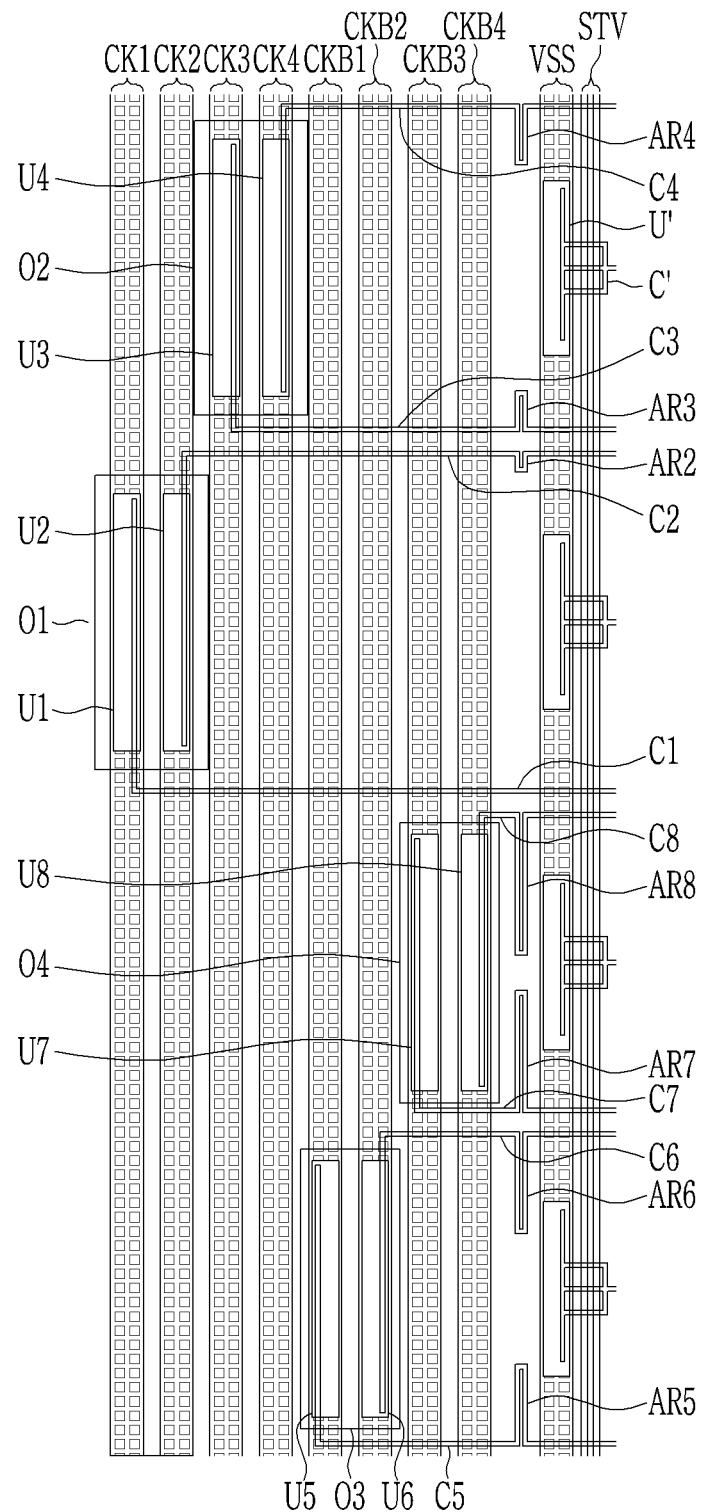
FIG. 13 is a top plan view of a wiring portion connected with a gate driver in another exemplary embodiment.
Figure 14A:
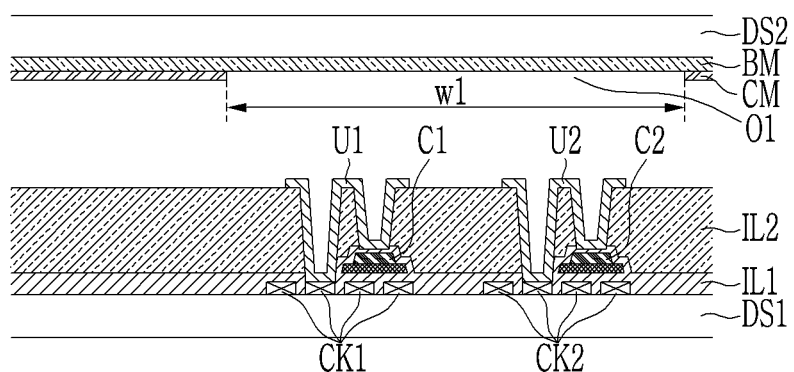
FIGS. 14A, 14B, 14C, and 14D are cross-sectional views of four clock wiring connection portions shown in FIG. 13.
Figure 14B:
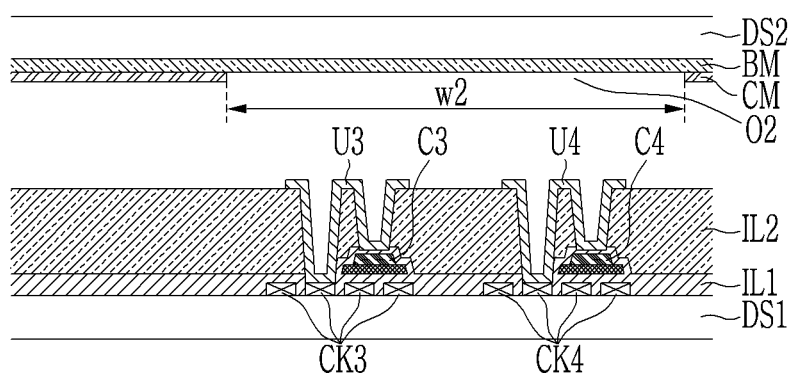
Figure 14C:
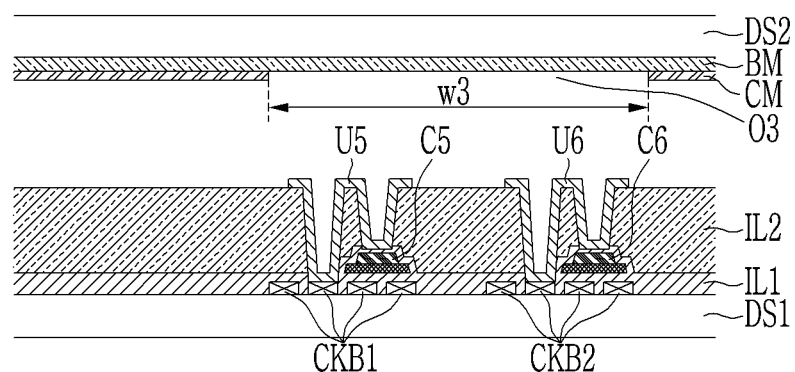
Figure 14D:
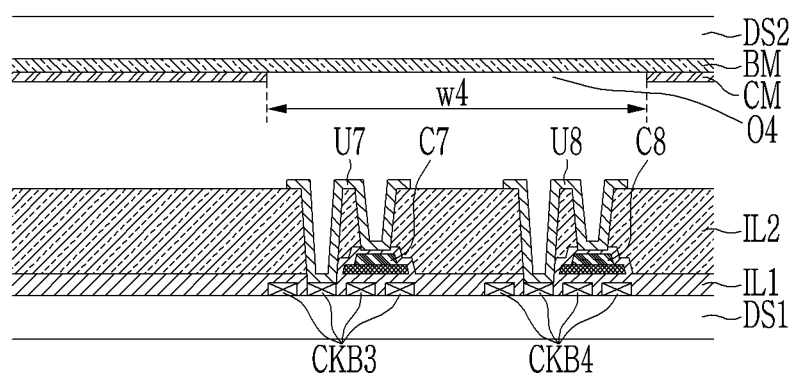

FIG. 13 is a top plan view of a wiring portion connected with a gate driver in another exemplary embodiment, and FIGS. 14A, 14B, 14C, and 14D are cross-sectional views of four clock wiring connection portions shown in FIG. 13.

In FIG. 13 and FIGS. 14A, 14B, 14C, and 14D, the first opening O1 and the second opening O2 are the same in size, and the third opening O3 and the fourth opening O4 are the same in size. However, the first opening O1 and the second opening O2 are larger than the third opening O3 and the fourth opening O4 in size. Thus, FIG. 13 and FIGS. 14A, 14B, 14C, and 14D illustrate an exemplary embodiment in which, when every two openings are grouped, the two openings have the same size even though an opening connected with a clock wire disposed away from the stage is larger than the other.

However, depending on exemplary embodiments, two adjacent openings do not need to be the same in size, and an exemplary embodiment in which the exemplary embodiment of FIG. 4 and FIGS. 5A-5D and the exemplary embodiment of FIG. 13 and FIGS. 14A, 14B, 14C, and 14D are properly combined is also applicable. That is, although two adjacent openings have the same size, other openings may be different in size depending on distances. In addition, depending on exemplary embodiments, three openings may have the same size.

Hereinafter, an exemplary variation of the exemplary embodiment of FIG. 11 and FIGS. 12A, 12B, 12C, 12D, 12E, and 12F will be described with reference to FIG. 15 and FIGS. 16A, 16B, 16C, 16D, 16E, and 16F.

Figure 15:
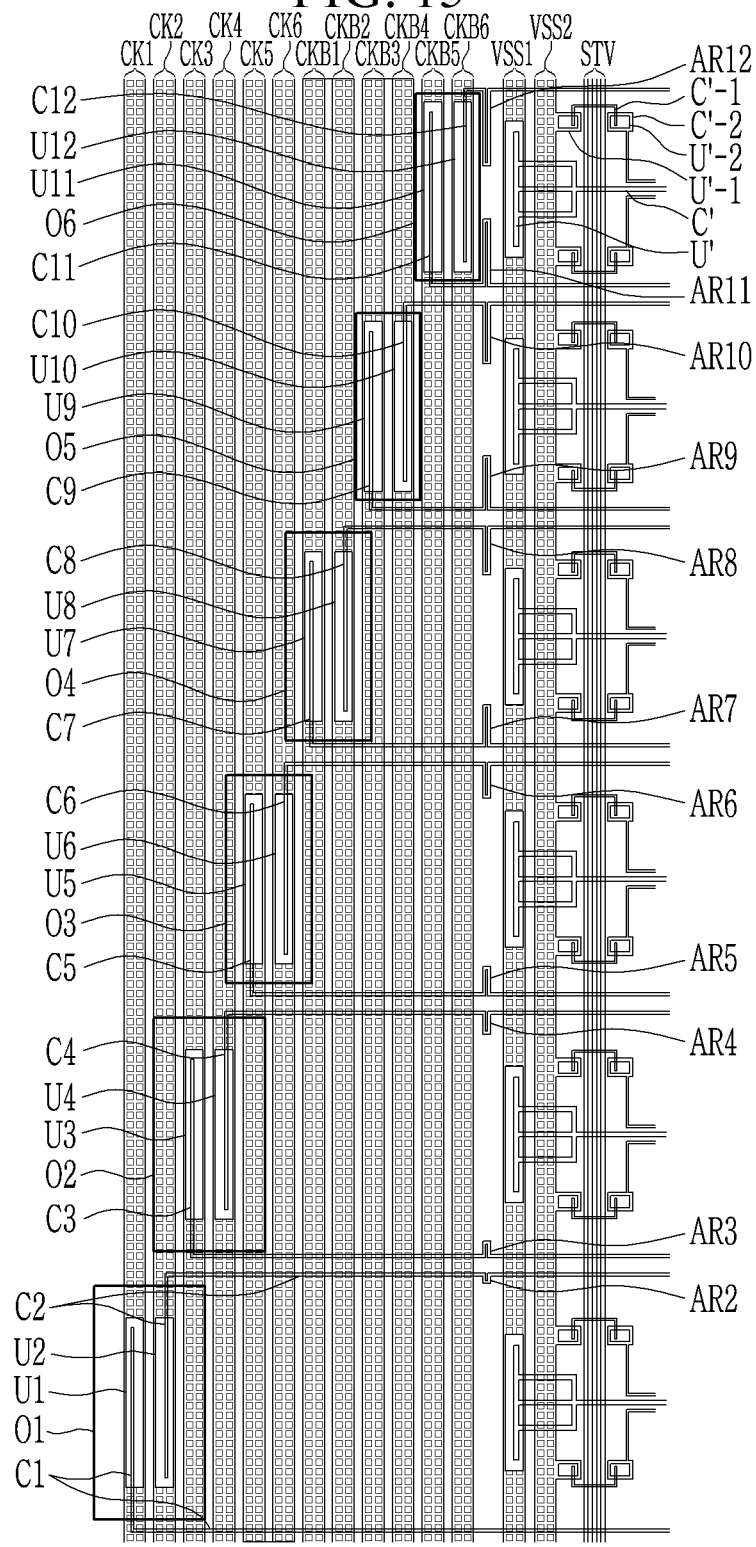
FIG. 15 is a top plan view illustrating a wiring portion connected with a gate driver according another exemplary embodiment.
Figure 16A:
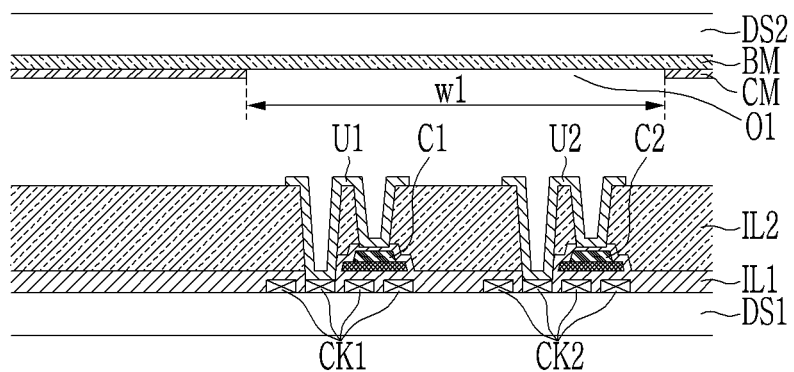
FIGS. 16A, 16B, 16C, 16D, 16E, and 16F are cross-sectional views of six clock wiring connection portion shown in FIG. 15.
Figure 16B:
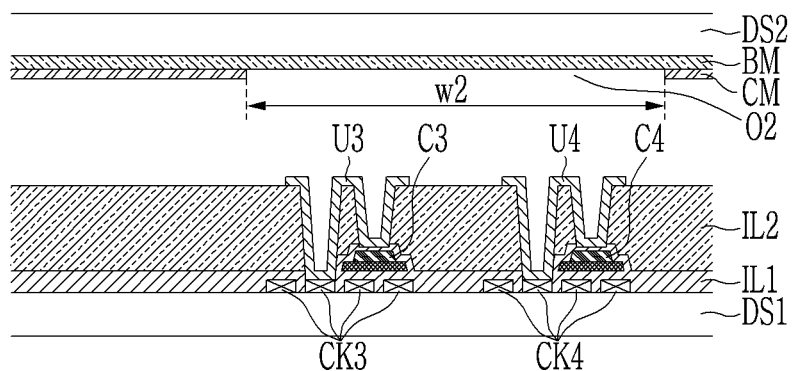
Figure 16C:
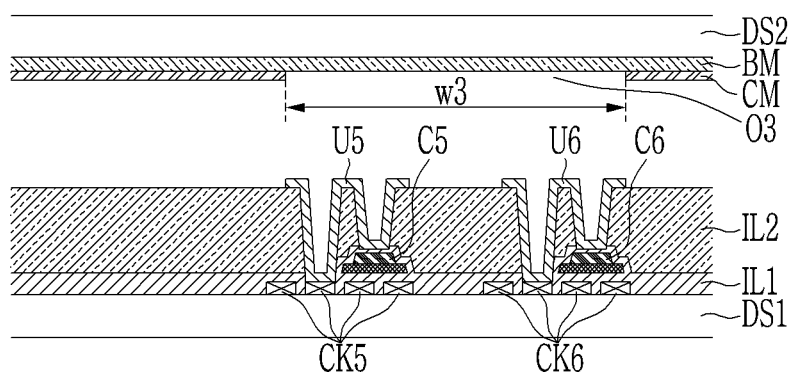
Figure 16D:
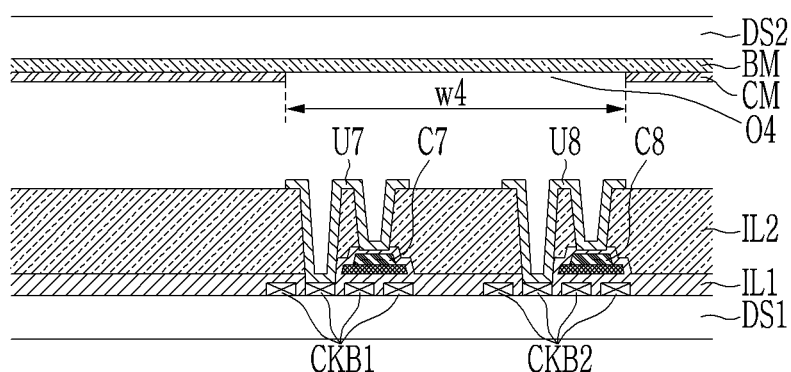
Figure 16E:
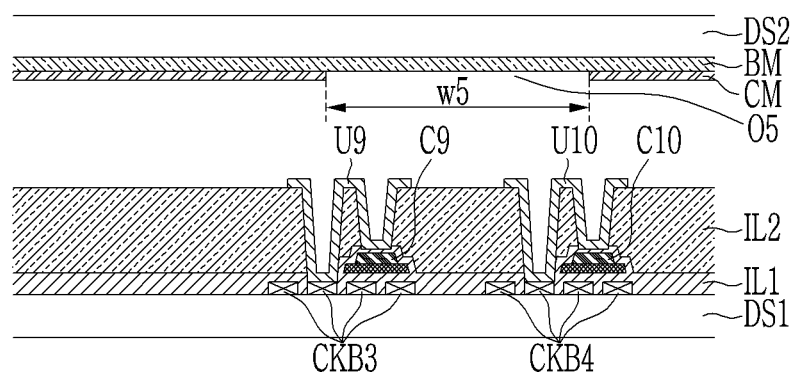
Figure 16F:
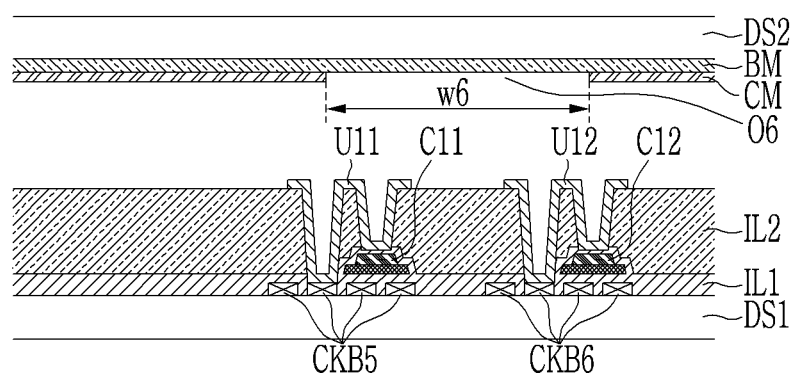

FIG. 15 is a top plan view illustrating a wiring portion connected with a gate driver according another exemplary embodiment, and FIGS. 16A, 16B, 16C, 16D, 16E, and 16F are cross-sectional views of six clock wiring connection portion shown in FIG. 15.

In FIG. 15 and FIGS. 16A, 16B, 16C, 16D, 16E, and 16F, a first opening O1 and a second opening O2 are the same in size, a third opening O3 and a fourth opening O4 are the same in size, and a fifth opening O5 and a sixth opening O6 are the same in size. However, the first opening O1 and the second opening O2 are larger than the third opening O3 and the fourth opening P4, and the third opening O3 and the fourth opening O4 are larger than the fifth opening O5 and the sixth opening O6. Thus, when every two openings are grouped, the two openings have the same size even though an opening connected with a clock wire disposed away from the stage is larger than the other.

However, depending on exemplary embodiments, two adjacent openings do not need to be the same in size, and an exemplary embodiment in which the exemplary embodiment of FIG. 11 and FIGS. 12A, 12B, 12C, 12D, 12E, and 12D and the exemplary embodiment of FIG. 15 and FIGS. 16A, 16B, 16C, 16D, 16E, and 16F are properly combined is also applicable. That is, although two adjacent openings have the same size, other openings may be different in size depending on distances. In addition, depending on exemplary embodiments, three, four, or five openings may have the same size.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a first substrate including a display area and a non-display area, the first substrate comprising a gate driver disposed in the non-display area; and
    a second substrate comprising a common electrode, the second substrate being disposed apart from the first substrate,
    wherein the gate driver comprises:
        a first clock wire configured to supply a first clock signal;
        a second clock wire configured to supply a second clock signal different from the first clock signal;

a first stage configured to receive the first clock signal from the first clock wire;
a second stage configured to receive the second clock signal from the second clock wire;
a first connection line connecting the first clock wire and the first stage;
a second connection line connecting the second clock wire and the second stage;
a first contact portion electrically connecting the first clock wire and the first connection line; and
a second contact portion electrically connecting the second clock wire and the second connection line,
wherein the common electrode comprises:
a first opening corresponding to the first contact portion; and
a second opening corresponding to the second contact portion, and
wherein the first opening and the second opening have different size in a plan view.

2. The display device of claim 1, wherein the first substrate further comprises a gate conductive layer comprising the first clock wire and the second clock wire.

3. The display device of claim 2, wherein the first substrate further comprises a data conductive layer comprising the first connection line and the second connection line.

4. The display device of claim 3, wherein the first substrate further comprises a pixel electrode layer comprising the first contact portion and the second contact portion.

5. The display device of claim 4, further comprising:
a first insulation layer disposed between the gate conductive layer and the data conductive layer; and
a second insulation layer disposed between the data conductive layer and the pixel electrode layer,
wherein openings are formed in the first insulation layer and the second insulation layer, openings respectively exposing a part of the first clock wire, a part of the second clock wire, a part of the first connection line, and a part of the second connection line,
wherein the first contact portion connects the first clock wire and the first connection line to the first insulation layer and the second insulation layer, respectively, through the openings corresponding to an exposed part of the first clock wire and the part of the first connection line, and
wherein the second contact portion connects the second clock wire and the second connection line to the first insulation layer and the second insulation layer, respectively, through the openings corresponding to the exposed part of the second clock wire and the part of the second connection line.

6. The display device of claim 4, wherein the first opening has a larger planar area than the first contact portion, the second opening has a larger planar area than the second contact portion, and
wherein the common electrode is not overlapping with the first contact portion and the second contact portion in the plan view.

7. The display device of claim 4, further comprising a semiconductor layer that is disposed below the first connection line and the second connection line.

8. The display device of claim 1, wherein the first connection line comprises a first section extending in a first direction and a second section extending in a second direction bent from the first section, the second section of the first connection line overlapping with the first clock wire, and
wherein the second connection line comprises a first section extending in the first direction and a second section extending in the second direction bent from the first section, the second section of the second connection line overlapping with the second clock wire.

9. The display device of claim 1, wherein openings are formed in the first clock wire and the second clock wire such that light is transmitted therethrough.

10. The display device of claim 1, wherein at least a part of the first clock signal having an enable level overlaps with a part of the second clock signal having the enable level.

11. The display device of claim 1, wherein the first clock wire is distanced from the first stage at a first distance, and the second clock wire is distanced from the second stage at a second distance,
wherein the first opening is larger than the second opening in the plan view and the first distance is greater than the second distance.

12. The display device of claim 11, wherein at least one of the first connection line and the second connection line comprises an additional resistor,
wherein the first connection line and the second connection line have a same resistance, and
wherein the additional resistor is configured to compensate for a difference in length between the first distance and the second distance to make a length of the first connection line and the second connection line substantially equal.

13. The display device of claim 1, wherein the gate driver further comprises:
third clock wire configured to supply a third clock signal;
a third stage configured to receive the third clock signal from the third clock wire;
a third connection line connecting the third clock wire and the third stage; and
a third contact portion electrically connecting the third clock wire and the third connection line,
wherein the common electrode further comprises:
a third opening corresponding to the third contact portion, and
wherein the third opening has a same size as one of the first opening and the second opening in the plan view.

14. The display device of claim 1, wherein the gate driver further comprises:
a third clock wire configured to supply a third clock signal;
a fourth clock wire configured to supply a fourth clock signal;
a third stage configured to receive the third clock signal from the third clock wire;
a fourth stage configured to receive the fourth clock signal from the fourth clock wire;
a third connection line connecting the third clock wire and the third stage;
a fourth connection line connecting the fourth clock wire and the fourth stage;
a third contact portion electrically connecting the third clock wire and the third connection line; and
a fourth contact portion electrically connecting the fourth clock wire and the fourth connection line,
wherein the first opening corresponds to the third contact portion, and
wherein the second opening corresponds to the fourth contact portion.

15. A display device comprising:
a first substrate including a display area and a non-display area, the first substrate comprising a gate driver disposed in the non-display area; and a second substrate that comprises a common electrode, the second substrate being disposed apart from the first substrate, wherein the gate driver comprises:
- a plurality of clock wires configured to supply a plurality of clock signals;
- a plurality of stages configured to receive the plurality of clock signals respectively from the plurality of clock wires; and
- a plurality of connection lines electrically connecting the plurality of clock wires respectively with the plurality of stages, wherein the common electrode comprises a plurality of openings corresponding to portions where the plurality of connection lines and the plurality of clock wires are electrically connected, and wherein the plurality of openings comprises a first opening and a second opening, the first opening distanced farther than the second opening and the first opening is larger than the second opening in a plan view.

16. The display device of claim 15, wherein the plurality of clock wires comprise:
- a first clock wire configured to transmit a plurality of clock signals; and
- a second clock wire configured to transmit a plurality of clock bar signals, the plurality of clock bar signals being antiphase with respect to the plurality of clock signals.

17. The display device of claim 16, wherein a total number of clock wires is one of 8, 12, and 16.

18. The display device of claim 16, wherein the gate driver further comprises a low voltage wire and a start signal wire.

19. The display device of claim 18, wherein a number of start signal wires is half a number of clock wires.

20. The display device of claim 18, wherein the plurality of connection lines further comprises:
- a plurality of additional resistors having lengths corresponding to distance differences between the plurality of stages and the plurality of clock wires.

* * * * *